United States Patent
Miyazaki et al.

(10) Patent No.: US 6,300,807 B1
(45) Date of Patent: Oct. 9, 2001

(54) TIMING-CONTROL CIRCUIT DEVICE AND CLOCK DISTRIBUTION SYSTEM

(75) Inventors: Masayuki Miyazaki, Kokubunji; Koichiro Ishibashi, Warabi; Takeshi Sakata, Kodaira; Satoru Hanzawa; Hiroyuki Mizuno, both of Kokubunji; Kiyoshi Hasegawa, Fusa; Masaru Kokubo, Hnno; Hirokazu Aoki, Hachioji, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/388,438

(22) Filed: Sep. 2, 1999

(30) Foreign Application Priority Data

Sep. 4, 1998 (JP) .................................................. 10-250728
Apr. 15, 1999 (JP) .................................................. 11-107542

(51) Int. Cl.[7] ........................................................ H03L 7/06
(52) U.S. Cl. ........................... 327/158; 327/149; 327/161; 327/298
(58) Field of Search ................................. 327/146, 147, 327/149, 156, 158, 161, 298

(56) References Cited

U.S. PATENT DOCUMENTS 5,570,054 * 10/1996 Takla ..................... 327/292
5,858,205 * 11/1998 Ferraiolo et al. ............ 331/2
6,104,222 * 8/2000 Embree ................. 327/156

FOREIGN PATENT DOCUMENTS 8-237091    9/1996   (JP) .

OTHER PUBLICATIONS

IEEE 1998 Custom Integrated Circuits Conference, "The Direct Skew Detect Synchronous Mirror Delay (Direct SMD) for ASICs", T. Saeki et al, pp. 511–515.

IEEE International Solid–State Circuits Conference, 1995, Digest of Technical Papers, pp. 112–113.

IEEE International Solid–State Circuits Conference, 1998, Digest of Technical Papers, pp. 158–159.

1997 Symposium on VLSI Circuits Digest of Technical Papers, pp. 109–110.

* cited by examiner

Primary Examiner—Terry D. Cunningham
Assistant Examiner—Quan Tra
(74) Attorney, Agent, or Firm—Mattingly, Stanger & Malur, P.C.

(57) ABSTRACT

A timing-control circuit device, which uses a synchronous mirror delay circuit, for keeping the synchronization between clock signals in phase even at a load change. A reference clock signal (clkin 11) is entered to a timing-control circuit (SMDF 14) and used to generate an internal clock (dclk 12), then generates an external clock (clkout 13) through a buffer (BUF 15). The external clock signal is fed back to the timing-control circuit (SMDF 14) and used to generate an internal clock signal so as to synchronize the external clock signal in phase with the reference clock signal. The timing-control circuit is provided with a circuit (FDA 21, MCC 22) for detecting a phase difference between the internal clock signal and the external clock signal, as well as a delay circuit (DCL 24) for controlling a delay time, so that the delay circuit (DCL 24) can change the delay time according to the detected phase difference.

27 Claims, 23 Drawing Sheets

FIG. 4
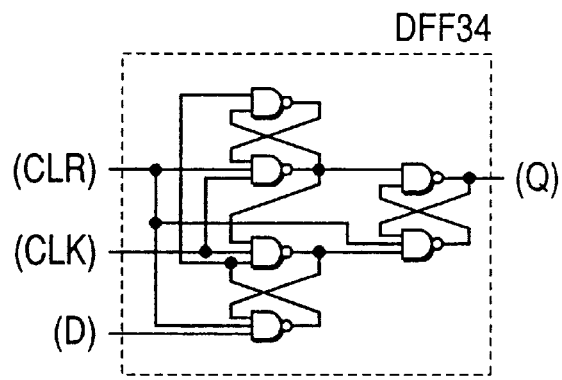
FIG. 5
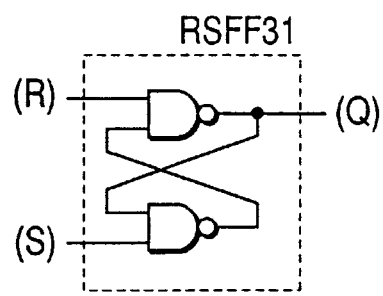
FIG. 6
| R | S | Q |
|---|---|---|
| 0 | 0 | 1 |
| 0 | 1 | 1 |
| 1 | 0 | 0 |
| 1 | 1 | φ (NO TRANSITION) |

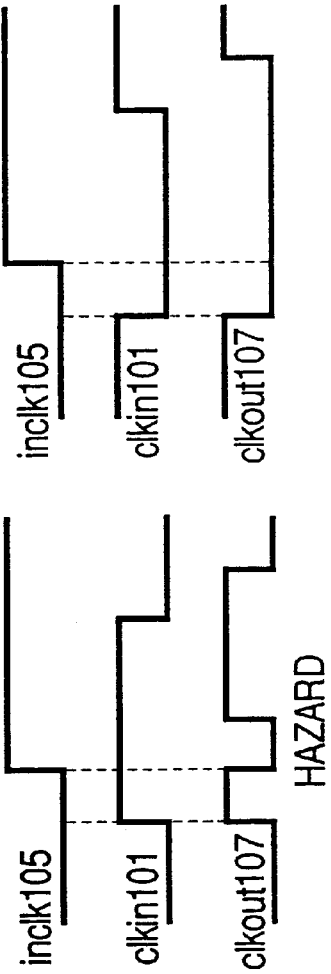
FIG. 34(a)
FIG. 34(b)
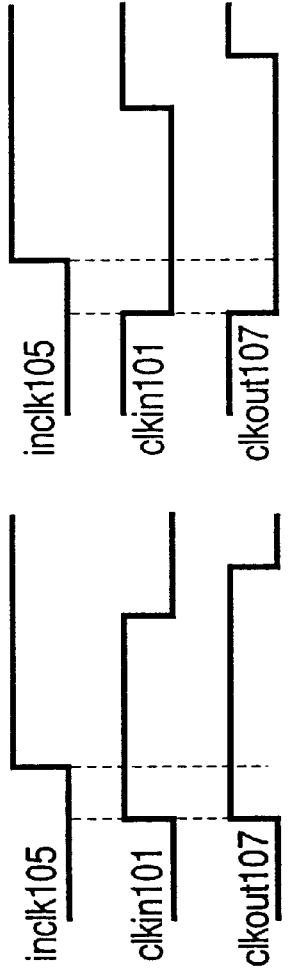
FIG. 34(c)
FIG. 34(d)
CASE THAT NAND CONSTRUCTS SELECTOR
(CLOCK SIGNAL 105)
(EXTERNAL CLOCK SIGNAL 101)
(INNER CLOCK SIGNAL 107)
CASE THAT TRI-STATE BUFFER CONSTRUCTS SELECTOR
(CLOCK SIGNAL 105)
(EXTERNAL CLOCK SIGNAL 101)
(INNER CLOCK SIGNAL 107)

TIMING-CONTROL CIRCUIT DEVICE AND CLOCK DISTRIBUTION SYSTEM

BACKGROUND OF THE INVENTION

1. Field of the Invention

The present invention relates to a semiconductor integrated circuit, more particularly to a timing-control circuit and a clock distribution system which can generate and transmit or distribute a synchronous signal.

2. Description of the Related Art

Conventionally, a phase-locked loop (PLL) has been used for a semiconductor integrated circuit which handles a clock signal. The PLL circuit, as shown in FIG. 45, comprises a phase frequency detector 280, a loop filter 281, and a voltage controlled oscillator 282. The PLL circuit detects a phase difference between the reference clock signal clkref 271 and the inner clock signal 277 entered to the phase frequency detector 280 and outputs a clock error signal clkerr 272. The loop filter 281 rectifies the clock error signal clkerr 272 to a DC voltage and outputs the voltage as a control signal cntsig 273. The voltage controlled oscillator 282 generates an output clock signal clkout 276, which has a frequency determined by the voltage of the control signal cntsig 273. The output clock signal cikout 276 is supplied to the phase frequency detector 280 as an inner clock signal cikin 277. The phase frequency detector 280 stops the output if no difference is detected between input signals, thereby the PLL operation is stabilized. At this time, the reference clock signal clkref 271 and the output clock signal clkout 276 are synchronized with each other in phase. The PLL circuit takes a long time (several $\mu$ sec) until the output clock signal clkout 276 generation is stabilized. Usually, when the subject system stands by, the PLL operation is stopped, thereby saving the power consumption.

However, the PLL circuit has a problem that the circuits needs a long settling time before it is restarted. In order to avoid such a long settling time, therefore, some systems are provided with a sleep mode respectively, which avoids stopping the PLL circuit even at the stand-by time. The PLL circuit thus consumes the power at its stand-by time.

The official gazette of Japanese Patent Laid-Open No.8-237091 has disclosed a synchronous mirror delay circuit for solving the disadvantages peculiar to such the PLL circuit. This synchronous mirror delay circuit does not multiply a frequency of any input clock signal. The circuit is dedicated just for phase synchronization. When compared with the PLL circuit, its power consumption is lower and its circuit size is smaller.

FIG. 44 shows a configuration of such a synchronous mirror delay circuit. The synchronous mirror delay circuit 260 comprises a forward delay array 261, a backward delay array 263, and a delay detect circuit 262. The input clock signal cikin 251, passing the replica of buffer 264 having a delay time of Tbuf2, becomes a delayed clock signal clkbuf 252, then entered to the forward delay array 261. The forward delay array 261 outputs a plurality of clock signals, each having a different delay time from the delayed clock signal clkbuf 252. The clock signals are transmitted to the delay detect circuit 262. Some of those signals from the forward delay array 261 have a delay time of (Tclk−Tbuf2). The delay detect circuit 262 detects the output positions of those (tclk−Tbuf2) signals using the input clock signal clkin 251 as a control signal. The Tclk indicates an cycle time of the input clock signal clkin 251. The Tbuf2 indicates an operation delay time of the replica of buffer 264. The delay detect circuit 262 transfers the detected signal to the backward delay array 263. The clock signal is transmitted in the reverse direction of the forward delay array 261 from the detected position in the backward delay array 263, so as to output a clock signal clksmd 253. The clock signal clksmd 253 has a delay time of (Tclk−Tbuf2) from the input clock signal clkin 251. The clock signal clksmd 253 from the synchronous mirror delay circuit is distributed to a predetermined circuit as a distribution clock signal clkout 254 at the clock buffer 265. If the delay time of the clock buffer 265 is Tbufl, the delay time difference (Tdel1) between the input clock signal cikin 251 and the distribution clock signal clkout 254 becomes (Tclk−Tbuf2+Tbuf1). If the delay time difference Tbuf1 is the same between the replica of buffer 264 and the clock buffer 265, the delay time difference between them becomes Tdel=Tclk. A signal synchronized with Mthe input clock signal can thus be supplied as a distribution clock signal. This distribution clock signal can be settled within several clock cycles after the operation is started.

In order to equalize both delay times (Tbuf2 of the replica of buffer 264 and Tbuf1 of the clock buffer 265) as shown in FIG. 44, the replica of buffer 264 should be designed according to the clock buffer 265. If the load of the clock buffer 265 is unknown or if the load of the clock buffer 265 is changed after the circuit is designed or if the load 266 is unknown or undefined, therefore, the replica of buffer 264 cannot compensate the delay time at this portion. In addition, no synchronous signal can be generated when the delay time of the clock buffer 265 is changed due to a change of the circuit characteristics caused by a manufacturing process and a temperature change during an operation.

The technique for considering changes of a load in the synchronous mirror delay circuit is described in "The Direct Detect Synchronous Mirror Delay (Direct SMD) for ASICs" IEEE CUSTOM INTEGRATED CIRCUITS CONFERENCE, pp511–514, 1998. In other words, the synchronous mirror delay circuit is not provided with any feed-back circuit, but provided two delay lines and one replica of delay circuit. The clock driver dummy circuit is omitted in the replica of delay circuit and a feed-back circuit is employed Ainstead of the dummy circuit. However, the document does not describe any concrete configuration of the synchronous mirror delay circuit. In addition, the synchronous mirror delay circuit can obtain output clock signals whose duty ratio is only 1/10 or so respectively. This is why the circuit cannot be employed for a system which uses both rising and falling of each clock signal.

SUMMARY OF THE INVENTION

Under such the circumstances, it is an object of the present invention to solve the problems of the conventional synchronous mirror delay circuit described above and provide a timing-control circuit device and a clock distribution system which can correspond to changes of an output load. More concretely, it is an object of the present invention to provide a timing-control circuit device and a clock distribution system which can supply a clock distribution signal kept synchronized in phase with an input clock signal even when the delay time of the clock signal is changed due to such a load as a clock buffer. The timing-control circuit device uses a synchronous mirror delay circuit.

Hereunder, some representative inventions disclosed in this specification will be described briefly.

The timing-control circuit (SMDF 14) of the present invention receives such a first transfer signal (clkin 11) as a reference clock signal, etc., thereby generating such a second transfer signal (clk 12) as an internal clock, and further generating such a third transfer signal (clkout 13) as an external clock, etc. through a buffer (BUF 15). At this time, the timing-control circuit (SMDF 14) receives a fed-back external clock signal, thereby generating an internal clock signal so as to establish the synchronization of phase between the external clock signal and the reference clock signal. Inside the timing-control circuit (SMDF 14) are provided circuits (FDA 21, MCC 22, and REG 23) for detecting a phase difference between internal clock and external clock, as well as a delay circuit (DCL 24) for controlling the delay time. The delay circuit can change the delay time according to the detected phase difference. Consequently, the same phase can be assumed between external and internal clock signals.

According to the means described above, the settling time within which a clock output is stabilized is such short. For example, therefore, the timing-control circuit can be started only when a clock is needed in the object semiconductor circuit device, thereby saving the power consumption, as well as suppressing degradation of the accuracy of an output signal, which is caused by a drop of the supply voltage. Since the fast settling characteristics of the synchronous mirror delay circuit are kept as are such way, the present invention can cope easily with load changes of a clock output in a load.

Hereunder, the present invention will be described more in detail. The timing-control circuit device is provided with a logic circuit (SMDF 14) for receiving the first transfer signal (clkin 11) and outputting the second transfer signal (dclk 12) and a load circuit (BUF 15, LD 16) for receiving the second transfer signal and outputting the third transfer signal (clkout 13). The logic circuit receives the fed-back third transfer signal, thereby generating the second transfer signal so as to synchronize the phase of the first transfer signal with the phase of the third transfer signal. The logic circuit comprises a first delay circuit array (FDA 21, MCC 22, and REG 23) for generating a control signal according to the phase difference and a second delay circuit array (DCL 24) which can change the delay time of the third transfer signal with respect to the first transfer signal according to a control signal.

The first delay circuit array comprises a forward delay circuit (FDA 21) for enabling a delayed signal from a plurality of positions respectively while transferring the third transfer signal with a little delay in one direction, and a detecting circuit (MCC 22) for generating a plurality of control signals (mcout) according to the phase difference between each delayed signal output from the forward delay circuit and the second transfer signal, so that any of generated control signals, which are regarded not to have a phase difference, indicates the output position of the delayed signal corresponding to itself so as to be distinguished from other output positions. The second delay circuit array (DCL 24) receives the plural control signals and gives a delay time to the first transfer signal corresponding to the delay time of the third transfer signal in a section up to the output position distinguished from other output positions in the forward delay circuit according to the control signal, thereby generating the second transfer signal.

In the above configuration, the timing-control circuit device can further be provided with a register (REG 23), which latches a control signal output from the control circuit synchronously with the second transfer signal and supplies the latched control signal to the second delay circuit array. At this time, the cycle of the second transfer signal is used to update the cycle of the control signal. In this case, however, a malfunction might occur between the detection timing of the detecting circuit (MCC 22) and the timing for latching the control signal by the register (REG 23). In order to avoid such a malfunction, therefore, the updating cycle (latching cycle) of the control signal in the storing circuit should be set longer. And for this purpose, the timing-control circuit device can further be provided with a divider (DFF 61) for receiving the second transfer signal (dclk 12) and outputting a divided signal; a buffer (BUF 65) for giving a delay time to the output signal from the divider, and another register (REG 23) for latching the control signal output from the control circuit synchronously with the cycle of the signal output from the buffer, then supplying the latched control signal to the second delay circuit array.

An operation delay can be reduced by reducing an input load capacity component recognizable from the second transfer signal. In order to achieve this reduction of such an operation delay, the first to third signal distribution circuits (BUFT 41, 42, and 43) should be employed, thereby branching an input signal in a plurality of buffers so that a distribution signal is supplied to each of the plural output terminals. At this time, the first signal distribution circuit is composed so as to receive the first transfer signal and output a distribution signal to the second delay circuit array (DCL 24), the second signal distribution circuit is composed so as to receive the second transfer signal and output a distribution signal to the control circuit (MCC 22), and the third signal distribution circuit is composed so as to receive the second transfer signal and output a distribution signal to the storing circuit (REG 23).

Generally, the state of the control signal is not stabilized while the phase of the third transfer signal is not synchronized with the phase of the first transfer signal. Such an unstable state must be prevented in order to stabilize the operation of a circuit. One of measures to be taken to prevent such a problem is employing the following configuration for the timing-control circuit device. At first, the timing-control circuit device is provided with a gate circuit (NOR 51) so that the plural control signals are set on the first level while the phase of the third transfer signal is not synchronized with the phase of the first transfer signal, and the control signals are then set on the second level when the above phase synchronization is established. And, when all the control signals are set on the first level, a pseudo control signal is generated on the second level, so that at least one control signal is set on the second level and the pseudo control signal is set on the first level. The second delay circuit array can also be composed so as to receive the pseudo signal and output the first transfer signal to a predetermined circuit as the second transfer signal according to the second level of the pseudo control signal.

The load circuit, as shown in FIG. 22, can branch the second transfer signal in a plurality of buffers, so that a branched signal is dispersed into those loads. A signal distributed to a load is assumed to become the third transfer signal at this time.

And furthermore, the timing-control circuit device is provided with a coarse timing-control circuit and a fine timing-control circuit. The coarse timing-control circuit synchronizes the phase of an output signal with the phase of a reference clock signal at a low accuracy, then the fine timing-control circuit synchronizes the phase of the output clock signal with the phase of the reference clock signal at a high accuracy. The size of a skew to be generated in an output clock signal is decided by the delay element in the fine timing-control circuit. The skew can be reduced by reducing the delay time per delay element stage in the fine timing-control circuit. The scale of the timing-control circuit can be adjusted freely by a delay time ratio between the delay element in the coarse timing-control circuit and the delay time in the fine timing-control circuit. The use of an optimized ratio will thus reduce the size, area, and power consumption of the circuit.

The clock distribution system, as shown in FIG. 23, comprises a semiconductor integrated circuit (LSI 81) provided with a timing-control circuit (SMDF 14); a clock generator (CPG 82); and a clock distributor (CDB 83); as well as a load connected to the semiconductor integrated circuit. The clock generator has a plurality of internal loads (LD 84), each of which is operated synchronously with the first clock signal (clkin 11) and the clock distribution circuit generates the fourth clock signal (clk 85) obtained by branching the fourth clock signal in a plurality of buffers. The timing-control circuit receives the first clock signal (clkin 11) and the third clock signal (clkfb 86) and outputs the second clock signal (clkout 13). The second clock signal is output outside the semiconductor integrated circuit and fed back as the third clock signal through a load. The fed-back third clock signal is then used to generate the second clock signal, thereby synchronizing the phase of the first clock signal with the phase of the third clock signal. The timing-control circuit thus comes to comprise the first delay circuit array for detecting a phase difference between the third clock signal and the second clock signal, thereby generating a control signal according to the detected phase difference; and the second delay circuit array, which can change the delay time of the third clock signal with respect to the first clock signal according to the control signal. Consequently, this configuration makes it possible to synchronize the clock signal (clkin 11) distributed in the semiconductor integrated circuit (LSI 81) with the clock signal (clkfb 86) distributed in the semiconductor integrated circuit (LSI 81) without using any external load.

As shown in FIG. 24, the second clock signal can be fed back directly to the timing-control circuit as the third clock signal in the semiconductor integrated circuit. If the signal is fed back so, one external terminal can be reduced from the semiconductor integrated circuit. In this case, however, it is expected that the follow-up property of the external load is a little more degraded than that of the above configuration of the timing-control circuit device.

Another clock distribution system, as shown in FIG. 25, includes the first semiconductor integrated circuit (LSI 91) provided with a timing-control circuit (SMDF 14); and the second semiconductor integrated circuits (LSI 92 to 94) operated synchronously with a clock signal respectively. The timing-control circuit receives the first clock signal (clkin 11) generated in the first semiconductor integrated circuit and the third clock signal (clkfb 95) supplied from outside the first semiconductor integrated circuit and outputs the second clock signal (clkout 13). The second clock signal is supplied to and fed back from the first semiconductor integrated circuit as the third clock signal. The fed-back third clock signal is used to generate the second clock signal so as to synchronize the phase of the first clock signal with the phase of the third clock signal. The timing-control circuit thus comes to comprise the first delay circuit array for detecting a phase difference between the third clock signal and the second clock signal, thereby generating a control signal according to the detected phase difference; and the second delay circuit array, which can change the delay time of the third clock signal according to the control signal with respect to the first clock signal. Consequently, the present invention can provide a clock distribution system which can keep supplying of a clock signal (clkfb 95) synchronously with an internal clock signal (clkin 11) even when a clock signal is supplied outside the semiconductor integrated circuit (LSI 91). In addition, the clock distribution system can supply a synchronous signal even when a clock signal is supplied to external using a long distance cable.

These and other objects, features and advantages of the present invention will become more apparent in view of the following detailed description of the preferred embodiments in conjunction with accompanying drawings.

BRIEF DESCRIPTION OF THE DRAWINGS

FIG. 4 is a circuit diagram of a D-type flip-flop circuit.

FIG. 5 is a circuit diagram of a RS-type flip-flop circuit.

FIG. 6 shows operation characteristics of the RS-type flip-flop circuit shown in FIG. 5.

FIG. 34 shows the operation waveforms of the ninth embodiment of the timing-control circuit device associated with the present invention.

DESCRIPTION OF THE PREFERRED EMBODIMENTS

Figure 1:
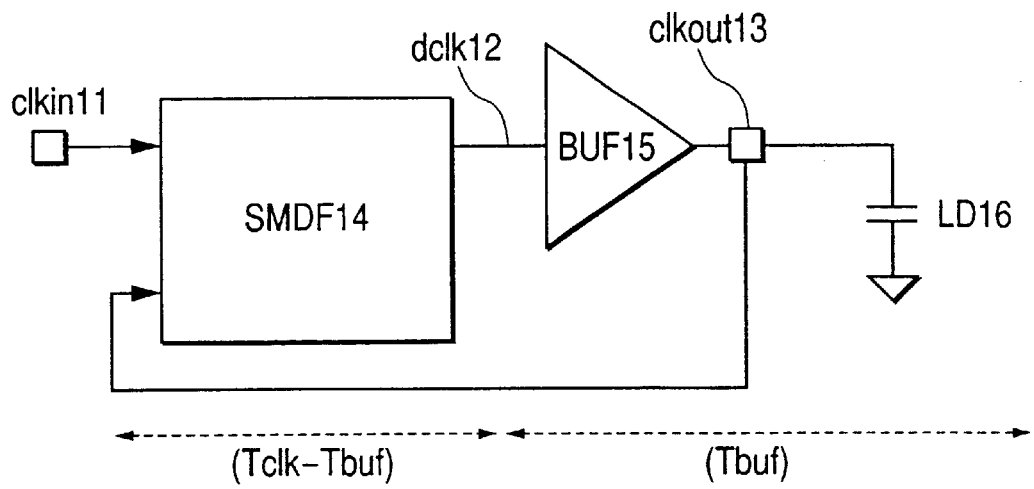
FIG. 1 is a block diagram of a timing-control circuit device associated with an embodiment of the present invention.

FIG. 1 shows a block diagram of a timing-control circuit associated with an embodiment of the present invention. The timing-control circuit 14 receives an external clock signal clkin 11 and an inner clock signal clkout 13, then outputs a delayed clock signal dclk 12 with a given delay time. The delayed clock signal dclk 12 is then entered to a clock buffer 15 and distributed to various circuits as the inner clock signal clkout 13. The timing-control circuit 14 then compares the phase of the external clock signal clkin 11 with the phase of the inner clock signal clkout 13 and outputs the delayed clock signal dclk 12 so as to adjust the phase difference to 0. If the transfer delay time between the clock buffer 15 and the load 16 shown in FIG. 1 is Tbuf, the timing-control circuit 14 gives a delay time of (Tclk−Tbuf) to the external clock signal clkin 11 whose clock cycle is Tclk, thereby generating the delayed clock signal dclk 12. As a result, the delay time difference between the external clock signal clkin 11 and the inner clock signal clkout 13 becomes (Tclk−Tbuf)+Tbuf=Tclk. The phase difference thus becomes 0. Consequently, the external clock signal clkin 11 entered from external is synchronized with the inner clock signal clkout 13 supplied internally. And, since the inner clock signal clkout 13 is fed back to the timing-control circuit 14 through the clock buffer 15 and the load 16, a synchronous signal can be generated according to the inner clock signal clkout 13 even when the delay time is changed by a signal output load.

Figure 2:
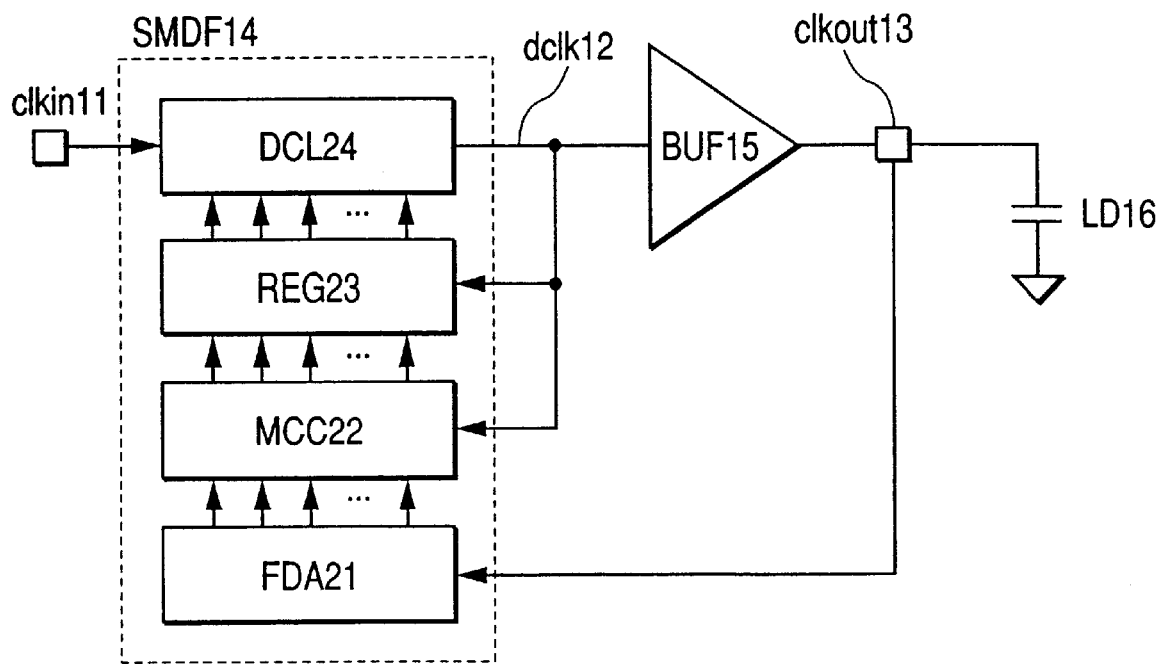
FIG. 2 is a block diagram for a configuration of a timing-control circuit SMDF 14 as a principle.

FIG. 2 shows a principle of a configuration of the timing-control circuit 14. The timing-control circuit 14 comprises a forward delay circuit array 21, a control circuit 22, a circuit for memorizing the control signal 23, and a delay controlled line 24. The inner clock signal clkout 13 is supplied to the forward delay circuit array 21 and output with a given delay time. The control circuit 22 receives the delayed clock signal dclk 12 output from the delay controlled line 24 as a control signal. The control circuit 22 selects only output signals from the forward delay circuit array 21, which has a delay time of (Tclk−Tbuf) respectively, then transfers the signals to the circuit for memorizing the control signal 23 as clock signals. The circuit for memorizing the control signal 23 detects and stores the positions of only the signals output as clock signals from the control circuit 22 with using the delayed clock signal dclk 12 as a control signal. The delay controlled line 24 receives the external clock signal clkin 11 from the position where the signal from the circuit for memorizing the control signal 23 is stored, then outputs the delayed clock signal dclk 12 with a delay time of (Tclk−Tbuf). The delayed clock signal dclk 12 generated by the timing-control circuit 14 is supplied as the inner clock signal clkout 13 through the clock buffer 15 and the load 16. Since the delayed clock signal dclk 12 and the inner clock signal clkout 13 have a delay time of Tbuf respectively at this time, the delay time between the input of the external clock signal clkin 11 and the output of the inner clock signal clkout 13 becomes (Tclk−Tbuf)+Tbuf=Tclk, and the phase difference becomes 0. This means that those signals are synchronized with each other. If the value of Tbuf is changed, the position of the circuit array to which the control circuit 22 transfers the clock signal is also changed, so that the clock signals are kept synchronized with each other.

Figure 3:
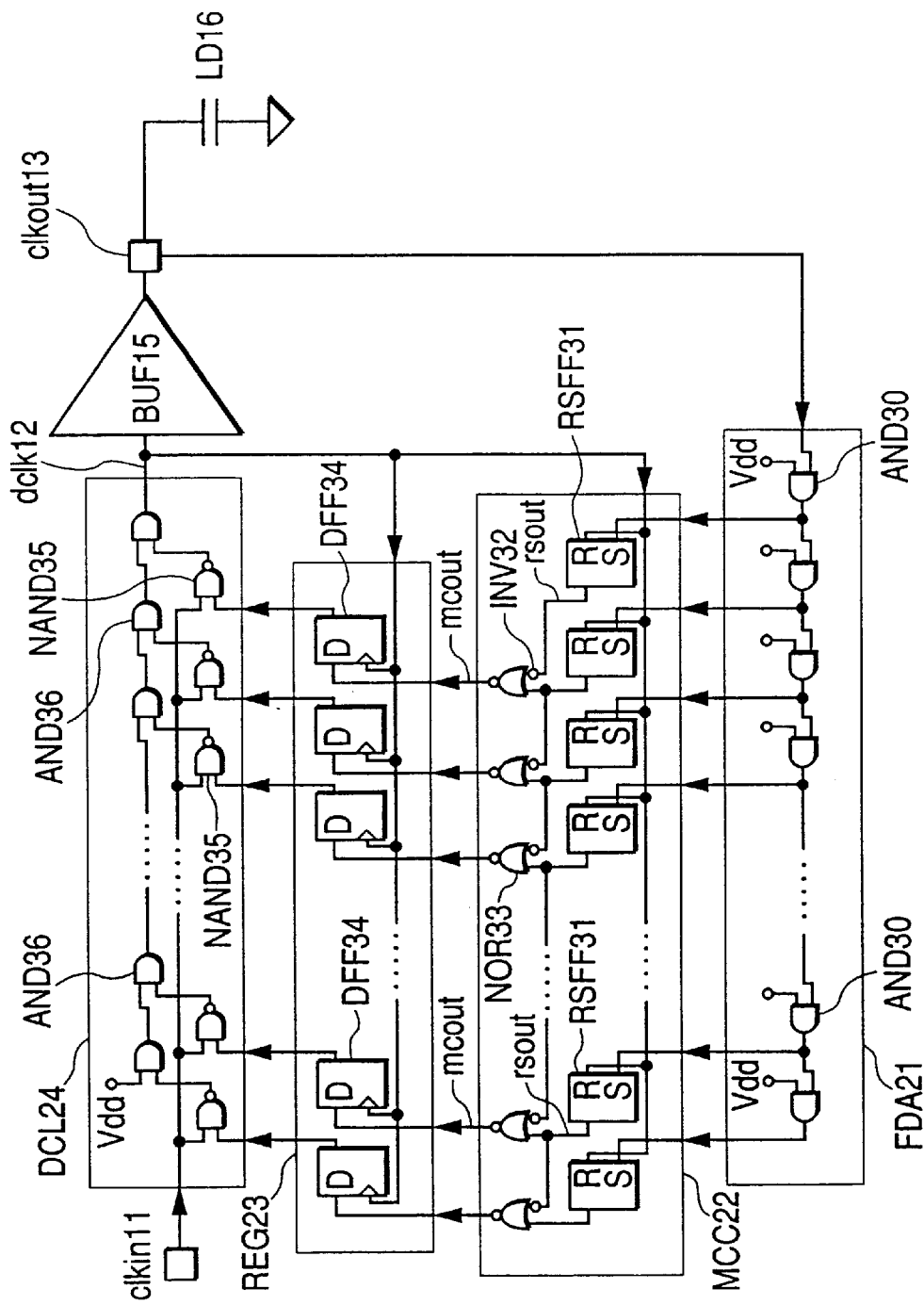
FIG. 3 is a detailed logical circuit diagram of the timing-control circuit SMDF 14.

FIG. 3 shows a concrete logic circuit diagram of the timing-control circuit 14. The forward delay circuit array 21 is composed of AND gates 30 connected serially. The output of each AND gate 30 is delayed by a fixed time. The inner clock signal clkout 13 is supplied to one input terminal of each AND gate 30 in the first stage. And, a signal which is given a logic value "1" (high level) due to the supply voltage Vdd is supplied to the other input terminal of the AND gate 30.

Figure 7:
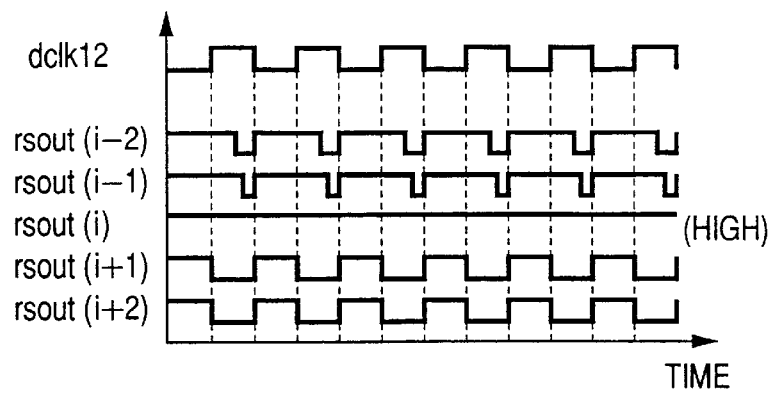
FIG. 7 shows the operation waveforms of the RS-type flip-flop circuit shown in FIG. 5.
Figure 8:
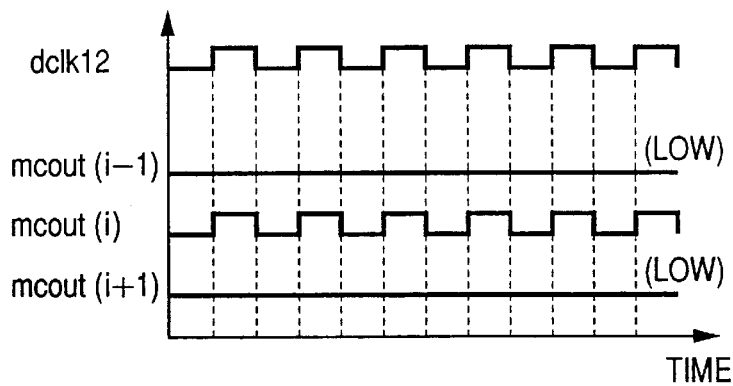
FIG. 8 shows operation waveforms of a control circuit MCC 22.

The control circuit 22 comprises an RS-type flip-flop circuit 31 and an inverter 32, and an NOR gate 33. The RS-type flip-flop circuit 31 can be composed of NAND gates as shown in FIG. 5. The operation of the RS-type flip-flop circuit 31 is as shown in FIG. 6, so the output waveform rsout of the RS-type flip-flop circuit 31 provided in the control circuit 22 becomes as shown in FIG. 7. In other words, the RS-type flip-flop circuit 31 has a set signal input terminal S, a reset signal input terminal R, and an output terminal Q. When the phase difference between both input clock signals is 0, the RS-type flip-flop circuit 31 outputs a high level signal as rsout (i) shown in FIG. 7. Since the RS-type flip-flop circuit 31 in the first stage in the control circuit 22 receives a delayed signal of the inner clock signal clkout 13 as a set signal and the delayed clock signal dclk 12 as a reset signal, the input of the set signal is delayed from the input of the reset signal. The Tbuf is a delay time of the clock buffer 15. In this case, the waveform becomes just like rout(i−2) and rsout (i−1) shown in FIG. 7. The output of the forward delay circuit array 21 is delayed more each time the number of the AND gate 30 stages is increased The delay times of both set and reset signals of the RS-type flip-flop circuit 31 become equal to Tclk at the i-th stage, where the delay time (Tclk−Tbuf) from the input reaches (Tclk−Tbuf) in the first stage. Thus, the phase difference is eliminated from between those signals and the forward delay circuit array 21 outputs rsout(i) as shown in FIG. 7. And, the output waveform of the RS-type flip-flop circuit 31 in the subsequent stage becomes rsout(i+1) or srout(i+2). The output waveform mcout of the control circuit 22 also becomes as shown in FIG. 8. In other words, the same clock signal as the delayed clock signal dclk 12 is output only from the position of the output signal mcout (i) obtained from the position rsout (i) where the delay time from the internal clock signal becomes (Tclk−Tbuf) and from the position of the rsout(i+1) in the next stage. Low level signals are output from other positions.

The circuit for memorizing the control signal 23 is composed of a D-type flip-flop circuit 34. The D-type flip-flop circuit 34 can be composed as shown in FIG. 4.

The D-type flip-flop circuit 34 has a clearing terminal CLR, a clock terminal CLK, a data input terminal D, and a data output terminal Q. The delayed clock signal dclk 12 is supplied to the clock input terminal of the D-type flip-flop circuit 34 and the output signal mcout of the control circuit 22 is supplied to the data input terminal of the D-type flip-flop circuit 34. Only the D-type flip-flop circuit 34 that receives the mcout (i) signal outputs a high level control signal.

The delay controlled line 24 comprises NAND gates 35 and AND gates 36. The AND gates 36 are connected serially in the reverse direction of the forward delay circuit array 21 so that signals are transferred in the reverse direction of the forward delay circuit array 21. The delay controlled line 24 receives the external clock signal clkin 11 and transfers a change of the external clock signal clkin 11 to the AND gate array in the subsequent stage from the position where the output of the circuit for memorizing the control signal 23 is on the high level. Since it is the i-th stage (the first stage is close to the input of the clock buffer 15) that the output of the circuit for memorizing the control signal 23 enters the high level, the external clock signal clkin 11 is transferred to the AND gate 36 in the i-th stage in the delay controlled line 24. At this time, since the delay time is equivalent to a signal delay in the i-th stage in the forward delay circuit array 21, the delay time becomes (Tclk−Tbuf). And, since the delay time difference between the delayed clock signal dclk 12 and the inner clock signal clkout 13 is Tbuf, the delay time difference between the external clock signal clkin 11 and the inner clock signal clkout 13 becomes (Tclk−Tbuf)+Tbuf= Tclk, which is equal to one cycle time of the clock signal. The phases of both signals are thus synchronized. And, since the control circuit 22 measures the delay time difference between the delayed clock signal dclk 12 and the inner clock signal clkout 13, the synchronous clock can be kept generated even when the transferred clock delay time of the clock buffer 15 or the load 16 is changed.

Figure 9:
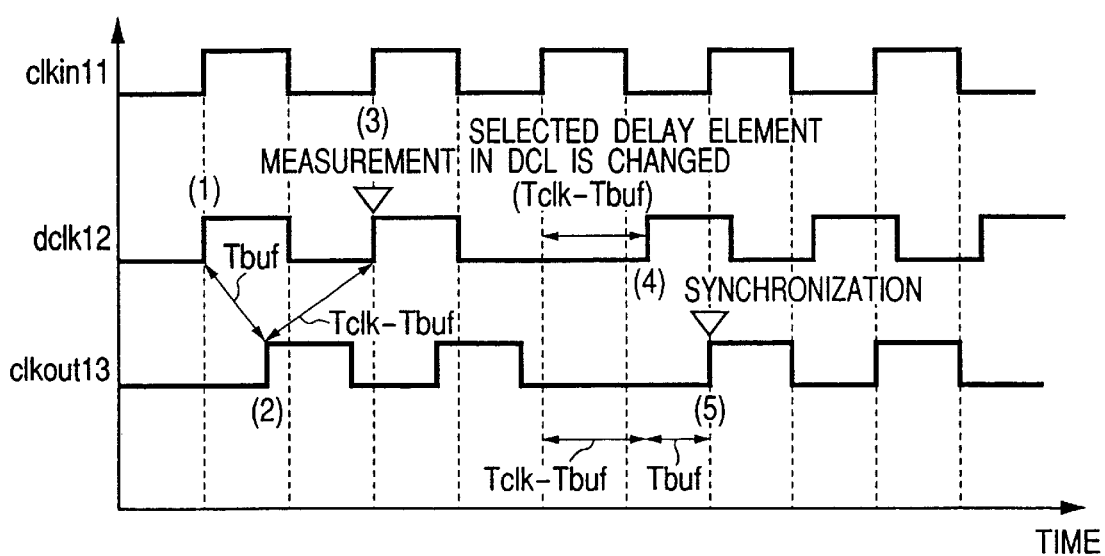
FIG. 9 shows a conceptual waveforms of the timing-control circuit device.

FIG. 9 shows an example of the conceptual operation waveforms of the timing-control circuit device. In FIG. 9, at first, the external clock signal clkin 11 is supplied to the circuit device. Before the synchronization is established, the delayed clock signal dclk 12, which is an output from the timing-control circuit 14, rises together with the external clock signal clkin 11 at (1). The activation of the inner clock signal clkout 13 is delayed by Tbuf in the clock buffer 15 and in the load 16, thus the inner clock signal clkout 13 rises at (2). If this inner clock signal clkout 13 is delayed in the forward delay circuit array 21 and overapped on the next rising at (3) of the delayed clock signal dclk 12 after a delay time of (Tclk−Tbuf), the delay time is measured and detected as a circuit position of the forward delay circuit array 21. The position of the next delayed clock signal dclk 12 to be connected to the input of the external clock signal clkin 11 in the delay controlled line 24 is decided, then transferred with a delay time (Tclk−Tbuf) and rises at (4). Accordingly, the inner clock signal clkout 13 is transferred with a delay time of Tbuf and rises at (5) and synchronized with the external clock signal clkin 11.

Figure 10:
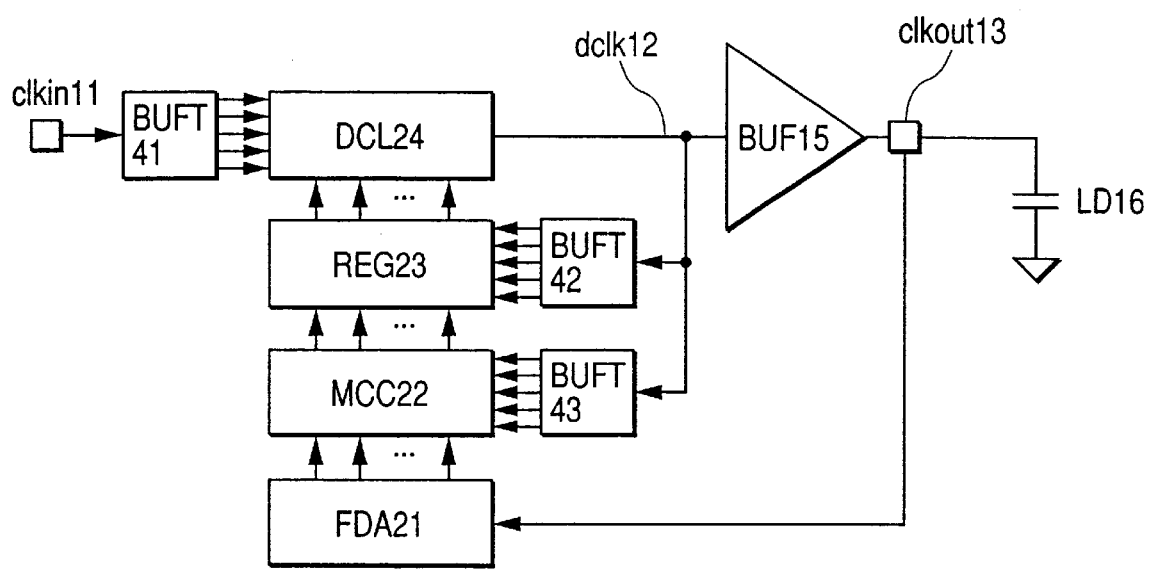
FIG. 10 is a block diagram for the second embodiment of the timing-control circuit device associated with the present invention.

FIG. 10 shows the second embodiment of the timing-controlling circuit device associated with the present invention. As shown clearly in FIG. 3, a total of large input capacity loads of many NAND gates 35 is applied to the input of the delay controlled line 24 to which the external clock signal clkin 11 is entered. In addition, a total of large input capacity loads of many flip-flop circuits 31 and 34 is applied to the input terminal of the control circuit 22 and the circuit for memorizing the control signal 23 to which the delayed clock signal dclk 12 is entered respectively. Such an input load capacity increases the delay time of a signal input. In order to disperse such the input load of a clock signal, clock distribution buffers 41, 42, and 43 are connected to the delay controlled line 24, the control circuit 22, and circuit for memorizing the control signal 23 respectively. This is very effective to reduce such a load, which can be checked directly from the external clock signal clkin 11 and the delayed clock signal dclk 12, thereby both of the external clock signal clkin 11 and the delayed clock signal dclk 12 are transferred smoothly to the next stage with a small delay time.

Figure 11:
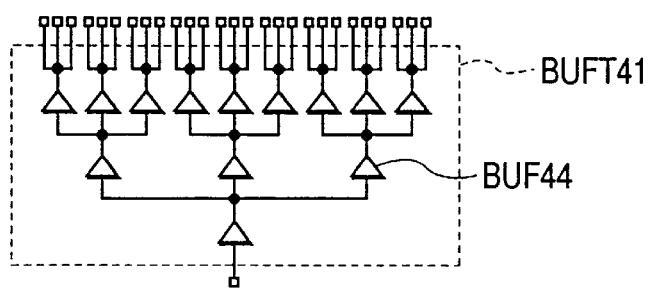
FIG. 11 is a circuit diagram of a clock distribution buffer.

FIG. 11 shows an example of the clock distribution buffer 41. In FIG. 1, the output of the buffer 44 is branched into three ways, and a clock distribution buffer 41 is used to distribute the clock signal. Such a buffer 44 is used to disperse one signal input to many signal outputs. In FIG. 11, the use of three buffers 44 in maximum will be enough for dispersing the load. Clock distribution buffers 41, 42 can also be composed as aforesaid.

Figure 12:
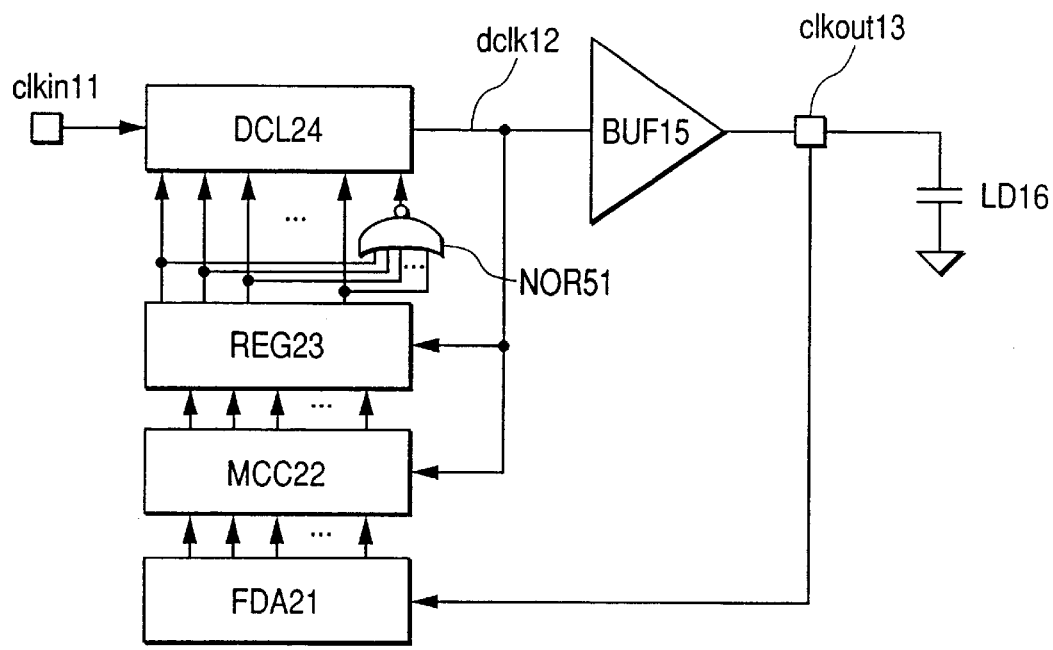
FIG. 12 is a block diagram for the third embodiment of the timing-control circuit device associated with the present invention.

FIG. 12 shows the third embodiment of the timing-control circuit device associated with the present invention. Since the control signal transferred from the circuit for memorizing the control signal 23 to the delay controlled line 24 is not decided yet in the initial status of the timing-control circuit device, the destination of the external clock signal cikin 11 transfer is not decided yet. Consequently, a negative logical OR signal, which is obtained from all the outputs of the circuit for memorizing the control signal 23, is supplied to the delay controlled line 24 as a control signal for the last stage while all the outputs of the circuit for memorizing the control signal 23 are on the low level. As a result, the external clock signal clkin 11 is output with no delay time. For this purpose, a multi-input NOR gate circuit 51 is inserted in the delay controlled line 24. This NOR gate 51 can decide the initial state of the timing-control circuit device, in which the external clock signal clkin 11 is synchronized with the external clock signal clkin 11.

Figure 13:
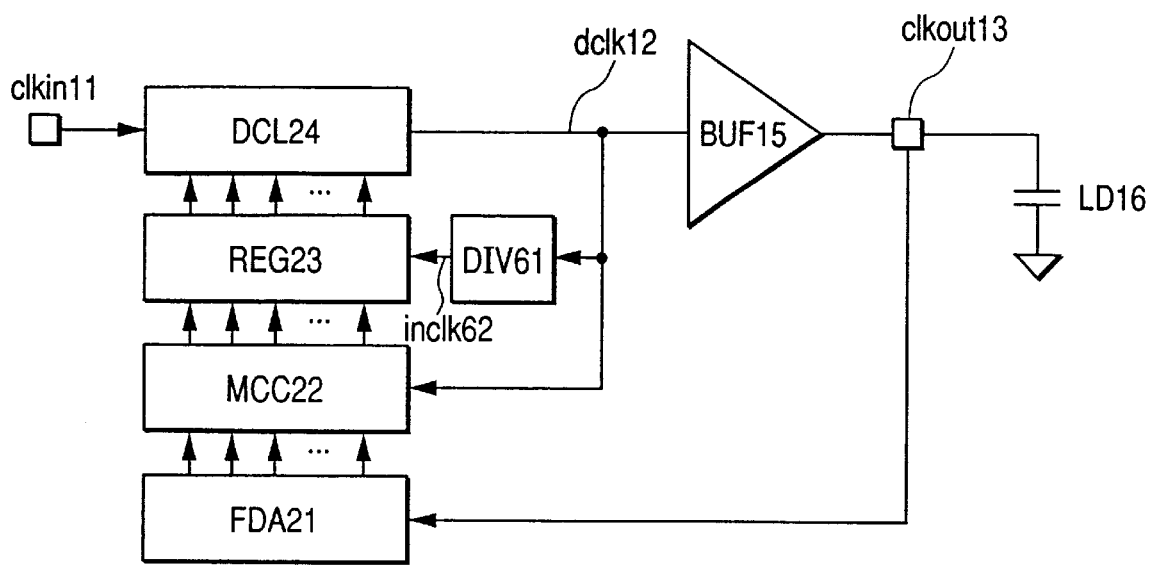
FIG. 13 is a block diagram for the fourth embodiment of the timing-control circuit device associated with the present invention.

FIG. 13 shows the fourth embodiment of the timing-control circuit device associated with the present invention. As described above with reference to FIG. 3, the circuit for memorizing the control signal 23 uses the D-type flip-flop circuit 34, thereby obtaining the delayed clock signal dclk 12 from the delay controlled line 24 as a clock signal. The circuit for memorizing the control signal 23 latches an output signal from the control circuit 22 as a data input for storing data. In FIG. 9, if the delay controlled line 24 measures the delay time at each cycle of the delayed clock signal dclk 12, thereby deciding the signal of the D-type flip-flop circuit 34, the delay controlled line 24 malfunctions when the signals are changed therein. In order to avoid this malfunction, therefore, a clock signal is supplied to the circuit for memorizing the control signal 23 for at least two or more cycles of the delayed clock signal dclk 12, thereby extending the delay time measuring cycle. This is why a divider 61 is inserted in a prior stage of the circuit for memorizing the control signal 23 and the delayed clock signal dclk 12 is divided, thereby generating the clock signal inclk for controlling 62 so as to be supplied to the circuit for memorizing the control signal 23 in the fourth embodiment shown in FIG. 13.

Figure 14:
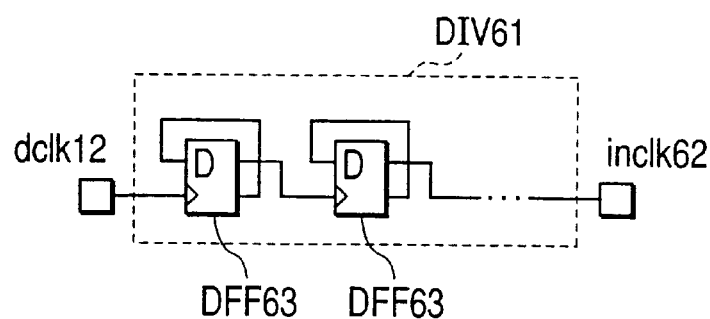
FIG. 14 is a circuit diagram for a general clock divider.
Figure 15:
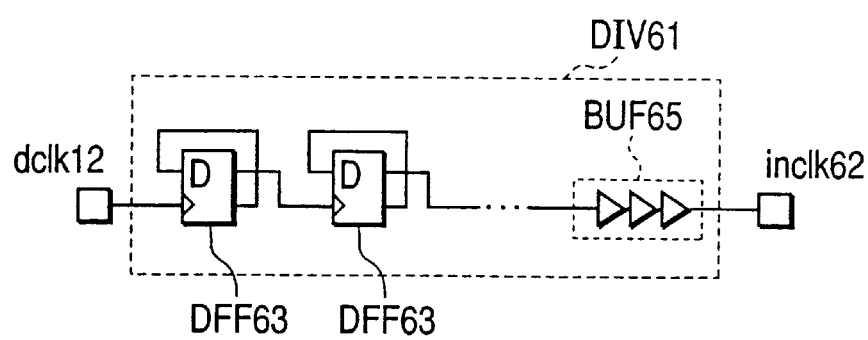
FIG. 15 is a circuit diagram of a clock divider provided with a buffer at its last stage.
Figure 16:
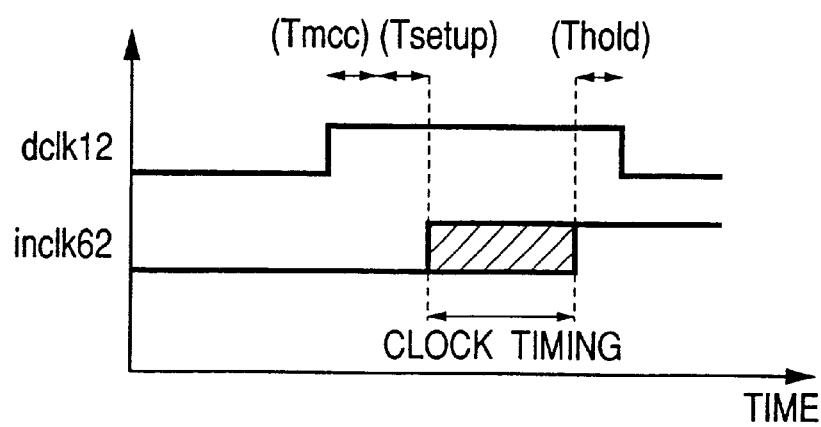
FIG. 16 shows the relationship between timings of a delay signal and an internal signal.
Figure 20:
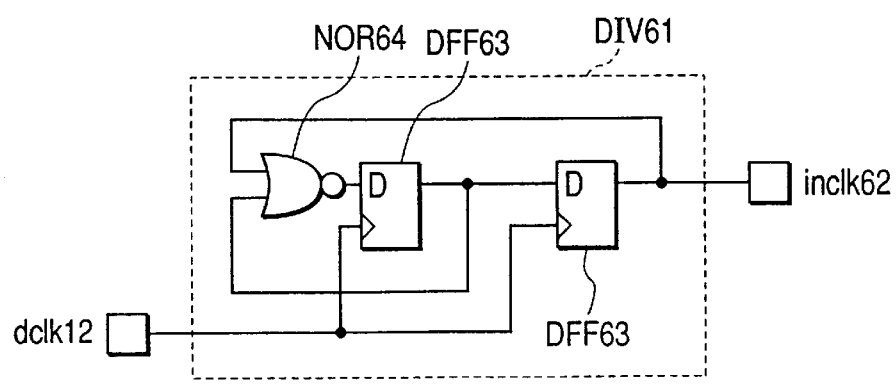
FIG. 20 is a logical circuit diagram of a clock divider, which divides a clock signal into a ⅓ clock signal.

FIG. 20 shows an example of a clock divider, which divides a clock signal into a ⅓ signal. The divider shown in FIG. 20 is composed of a plurality of D-type flip-flop circuits 63 and a NOR gate 64. The clock divider shown in FIG. 14 is a general one. This divider comprises a plurality of D-type flip-flop circuits 63. The clock signal input and the data signal input to the D-type flip-flop circuit 34 provided in the circuit for memorizing the control signal 23 must have the timings shown in FIG. 16. In other words, if the data input to the D-type flip-flop circuit 34 is a delayed clock signal dclk 12, the clock signal inclk for controlling 62, which is a clock signal, must rise while the delayed clock signal dclk 12 is on the low level and the control circuit 22 must be lower by the delay time Tmcc in data transfer and the set-up time Tsetup of the D-type flip-flop circuit 34 than the rising of the delayed clock signal dclk 12 and furthermore, earlier by the hold time Thold of the D-type flip-flop circuit 34 than the falling of the delayed clock signal dclk 12 as shown in FIG. 16. In order to satisfy these conditions, a buffer 65 is inserted in the output of the D-type flip-flop circuit 63 in the last stage as shown in FIG. 15, thereby entering a clock signal to the circuit for memorizing the control signal 23 as a clock signal inclk for controlling 62 with a proper delay time. The circuit can thus be prevented from malfunction.

Figure 17:
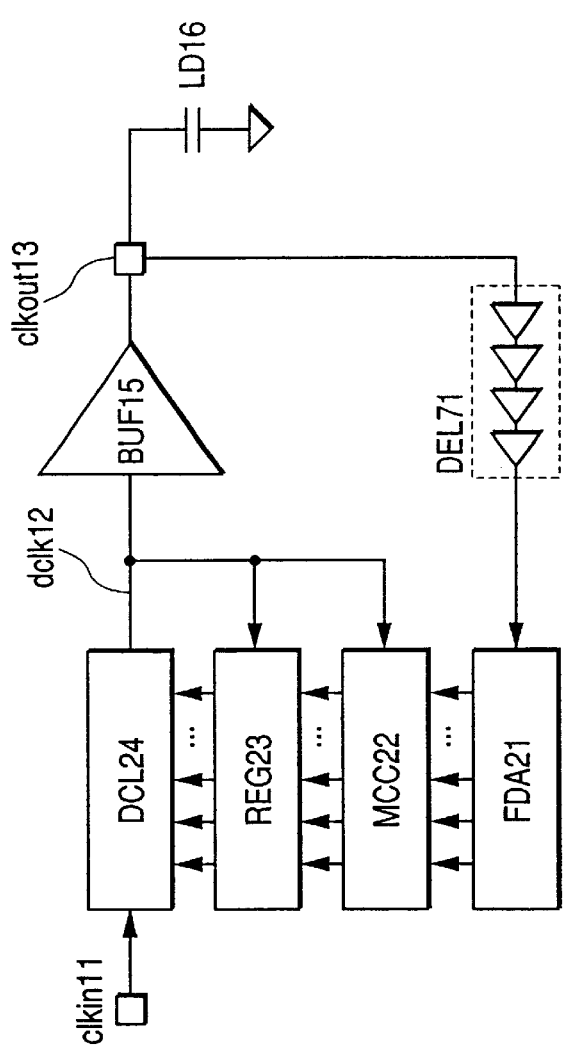
FIG. 17 is a block diagram for the fifth embodiment of the timing-control circuit device associated with the present invention.

FIG. 17 shows the fifth embodiment of the timing-control circuit device associated with the present invention. In this embodiment, the inner clock signal clkout 13 is fed back to the forward delay circuit array 21 via the delay circuit 71 so as to make a fine adjustment of the synchronization between the external clock signal clkin 11 and the inner clock signal clkout 13. The delay time of the delay circuit 71 can be Tin (the delay time of the external clock signal clkin 11 in the input buffer)+Tnand (the delay time at the NAND gate of the delay controlled line 24 in the last stage)+Tcdb (the delay time of the clock distribution buffer of the delayed clock signal dclk 12).

Figure 18:
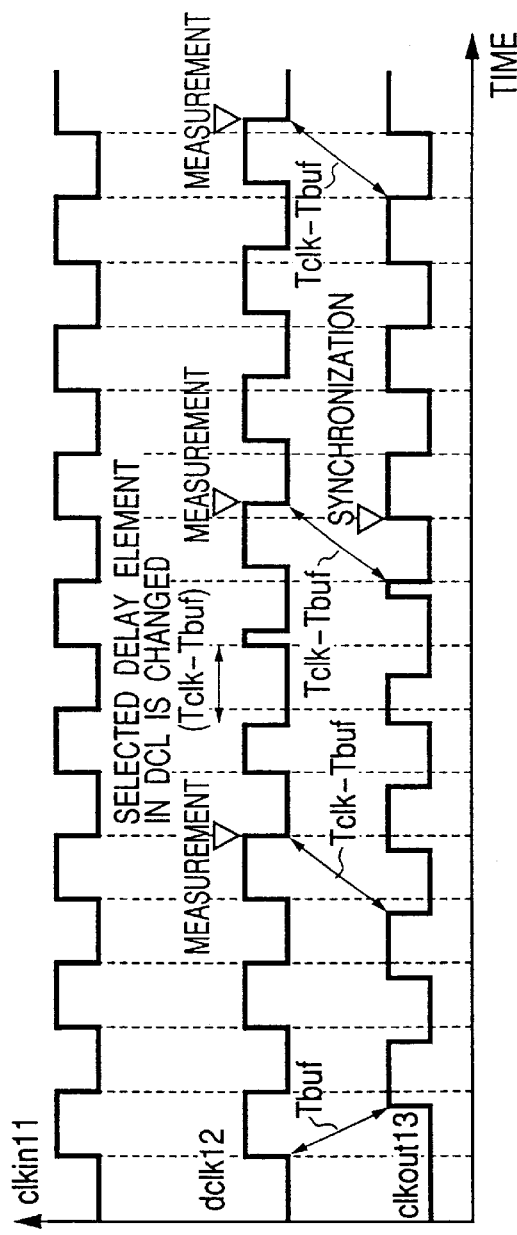
FIG. 18 is a timing chart for the operation waveforms of the timing-control circuit which includes all the additional functions shown in FIGS. 10, 12, 13, and 17.
Figure 19:
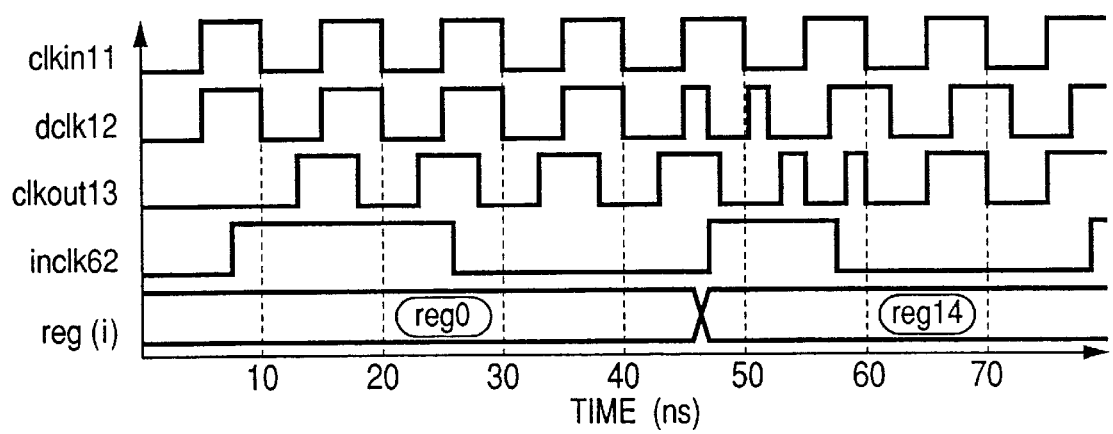
FIG. 19 is a timing chart for the waveforms in a simulation of the timing-control circuit which includes all the additional functions shown in FIGS. 10, 12, 13, and 17.

FIG. 18 shows the operation waveforms of the timing-control circuit, which includes all the additional functions shown in FIGS. 10, 12, 13, and 17. The delay time of the clock buffer is measured every three cycles of the delayed clock signal dclk 12, so that the internal clocks are synchronized at the sixth cycle as shown in FIG. 18. FIG. 19 shows waveforms in a simulation. In this case, the delay time is measured every four cycles of the delayed clock signal dclk 12. The control signal output position of the circuit for memorizing the control signal 23 is changed from reg0 to reg14 in the fifth cycle and the internal clocks are synchronized in the seventh cycle.

Figure 21:
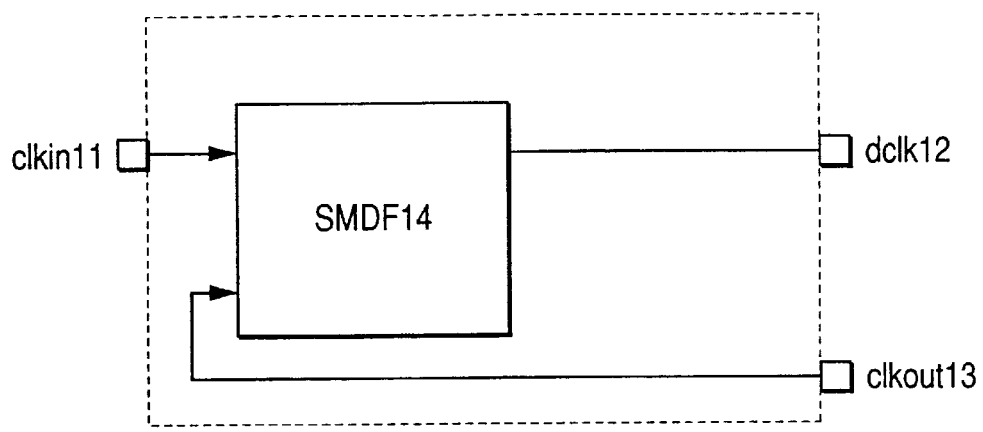
FIG. 21 is a block diagram of another embodiment of the present invention.

FIG. 21 shows another embodiment of the present invention. In this embodiment shown in FIG. 21, the timing-control circuit 14 receives the external clock signal clkin 11 and the inner clock signal clkout 13 and outputs the delayed clock signal dclk 12. If a given load is connected to the delayed clock signal dclk 12 in such a configuration of the timing-control circuit 14, a signal is fed back to the timing-control circuit 14 via the load as the external clock signal clkin 11, thereby the external clock signal clkin 11 and the inner clock signal clkout 13 can be kept synchronized independently of any load.

Figure 22:
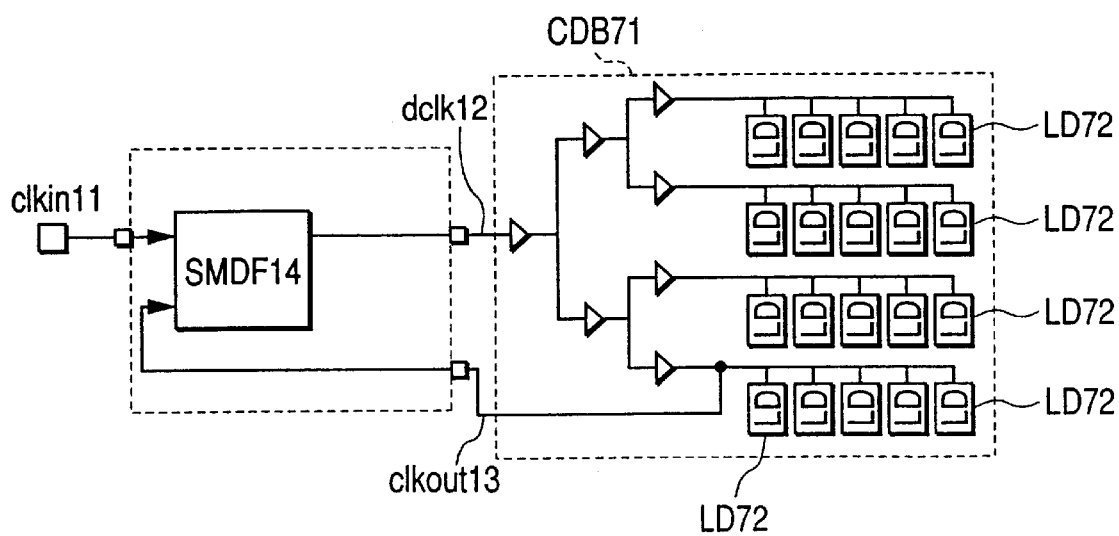
FIG. 22 is a block diagram of an embodiment of a clock distribution system associated with the present invention.

FIG. 22 shows an example of a clock distribution system associated with the present invention. The clock distribution system comprises a timing-control circuit 14 and a delay circuit 71. This system can keep supplying of the inner clock signal clkout 13 synchronized with the external clock signal cikin 11 regardless of the internal structure of the delay circuit 71. The timing-control circuit 14 receives the external clock signal clkin 11 and the inner clock signal clkout 13 and outputs the delayed clock signal dclk 12. The clock distribution buffer 71 receives the delayed clock signal dclk 12 and distributes a clock signal to the load 72 via a buffer. As an example of the load 72, a latch circuit needs a clock signal. And, since the clock signal supplied to the load 72 is fed back to the timing-control circuit 14 as the inner clock signal clkout 13, it is possible to generate the inner clock signal clkout 13 synchronized with the external clock signal clkin 11 regardless of the circuit configuration of the clock distribution buffer 71. This embodiment can thus form a timing-control circuit effective in a clock distribution system used for such a semiconductor IC device as a microprocessor, a synchronous DRAM, etc.

Figure 23:
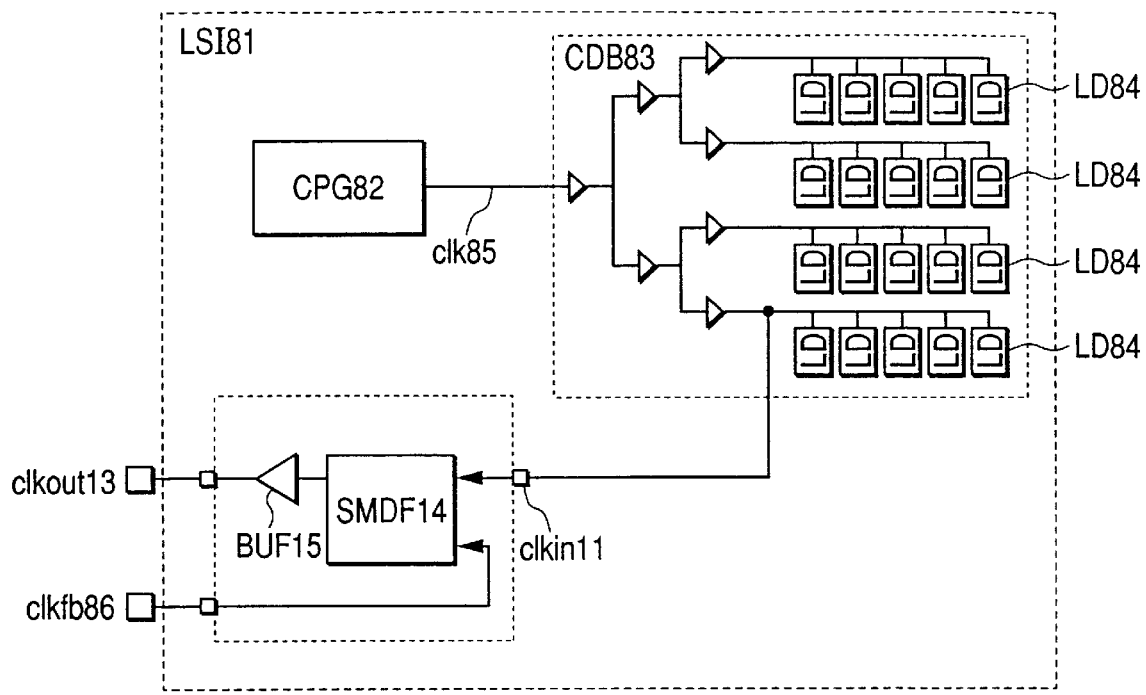
FIG. 23 is a block diagram of another embodiment of the clock distribution system associated with the present invention.

FIG. 23 shows another example of the clock distribution system associated with the present invention. In this example, the semiconductor integrated circuit device 81 comprises a clock pulse generator 82, a clock distribution buffer 83, a timing-control circuit 14, etc. The clock pulse generator 82 generates a clock signal clk 85 and distributes the clock signal to the load 84, etc., which need a clock signal respectively in the semiconductor integrated circuit device 81, using the clock distribution buffer 83. The timing-control circuit 14 receives the distributed clock signal and uses it as the external clock signal clkin 11 and outputs the inner clock signal clkout 13 to external from the semiconductor integrated circuit device 81 through the clock buffer 15. The clock signal distributed outside the semiconductor integrated circuit device 81 is entered to the semiconductor integrated circuit device 81 via a load as a feedback clock signal clkfb 86. Then, the signal is fed back to the timing-control circuit 14. This embodiment can thus compose a clock distribution system which can synchronize the external clock signal clkin 11 distributed in the semiconductor integrated circuit device 81 with the feedback clock signal clkfb 86 distributed outside the semiconductor integrated circuit device 81 regardless of any load.

Figure 24:
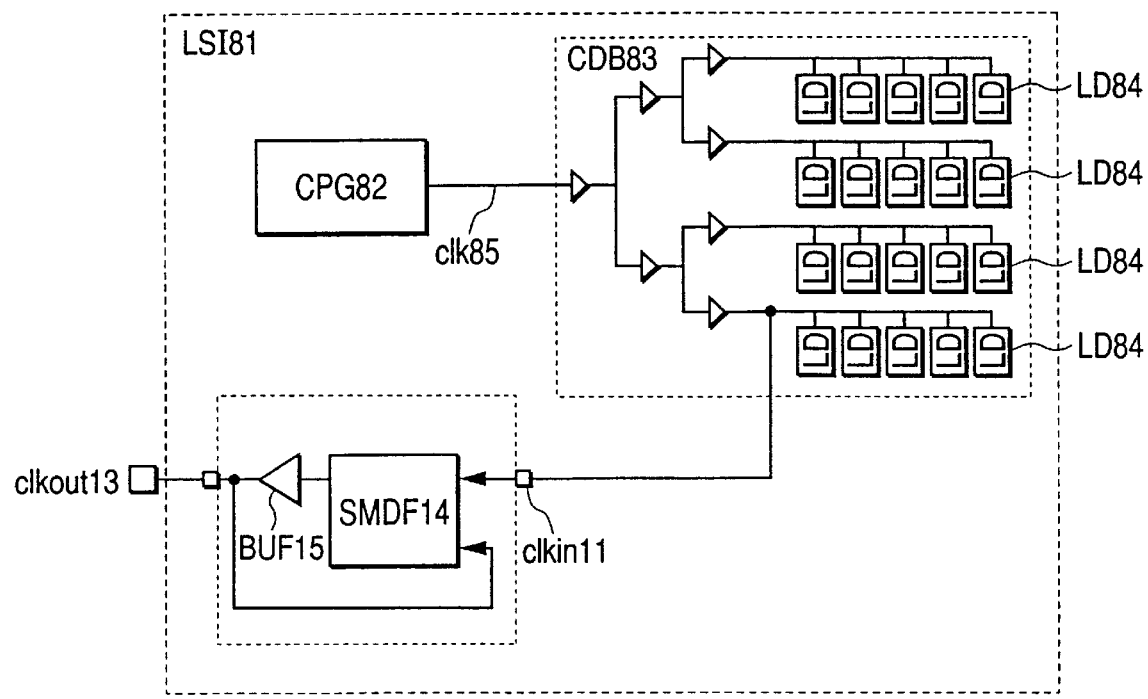
FIG. 24 is a block diagram of further another embodiment of the clock distribution system associated with the present invention.

FIG. 24 shows further another example of the clock distribution system associated with the present invention. In this example, the clock distribution system is built in the semiconductor integrated circuit device 81. Just like in the above example, the semiconductor integrated circuit device 81 includes a clock pulse generator 82, a clock distribution buffer 83, a timing-control circuit 14, etc. The clock pulse generator 82 generates a clock signal clk 85 and distributes the signal to the load 84, etc., which need a clock signal respectively in the semiconductor integrated circuit device 81, using the clock distribution buffer 83. The timing-control circuit 14 receives the distributed clock signal as the external clock signal clkin 11 and supplies the inner clock signal clkout 13 outside the semiconductor integrated circuit device 81 via the buffer The inner clock signal clkout 13 output from the clock buffer 15 is fed back to the timing-control circuit 14 as a feed-back signal. With such a configuration, this clock distribution system can synchronize the external clock signal clkin 11 distributed inside the semiconductor integrated circuit device 81 with the inner clock signal clkout 13 distributed outside the semiconductor integrated circuit device 81 regardless of any external load. The configuration shown in FIG. 23 is applicable when a delay is generated in the clock signal due to the load of such a distribution and the configuration shown in FIG. 24 is applicable only when a clock signal is distributed outside the semiconductor integrated circuit device 81 and no delay is generated due to the load of such a distribution, that is, when the load is not more than the capacity one.

Figure 25:
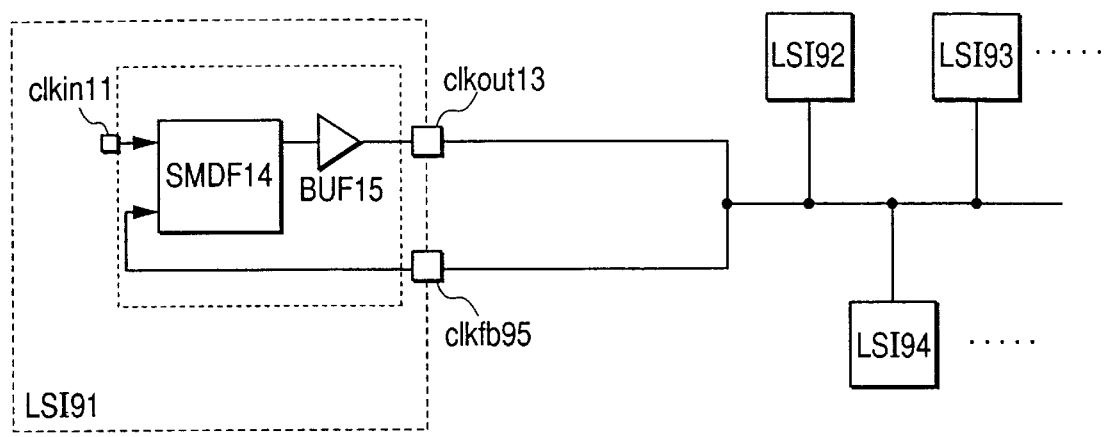
FIG. 25 is a block diagram of further another embodiment of the clock distribution system associated with the present invention.

FIG. 25 shows further another example of the clock distribution system associated with the present invention.

A semiconductor integrated circuit device 91 includes a timing-control circuit 14. The semiconductor integrated circuit device 91 is connected to a plurality of semiconductor integrated circuit devices 92, 93, and 94, which are such devices as DRAMs (Dynamic Random Access Memory) and need a clock signal respectively outside themselves. The timing-control circuit 14 receives the external clock signal clkin 11 inside the semiconductor integrated circuit device 91 and the feedback clock signal clkfb 95 outside the semiconductor integrated circuit device 91 and supplies a inner clock signal clkout 13 outside the semiconductor integrated circuit device 91 through the buffer 15. The inner clock signal clkout 13 is then supplied to the semiconductor integrated circuit devices 92 to 94 such as a DRAM, etc., which needs a clock signal for its wiring, etc. respectively. For the buffer 15, the semiconductor integrated circuit devices 92 to 94 are all loads. The inner clock signal clkout 13 supplied to each of those loads is fed back to the semiconductor integrated circuit device 91 as the feedback clock signal clkfb 95, then supplied to the timing-control circuit 14. With such a configuration, the clock distribution system can keep supplying of the feedback clock signal clkfb 95 synchronized with the external clock signal clkin 11 even when a clock signal is supplied outside the semiconductor integrated circuit device 91 and the number of external loads is changed, for example, for an increase. The system can also supply such a synchronous signal when a long-distance cable is used for supplying a clock signal.

The timing-control circuits shown in FIGS. 1 through 20 have a short settling time of 2 to 3 cycles respectively. Each of those circuits can keep generating of a synchronous signal even when its output load is changed and transfer the duty ratio of its input clock signal as is or output a signal with a given duty ratio by adjusting the delay element 36 of its delay controlled line.

The minimum clock frequency can be given at Fmin=1/(nxTdel) for operating each of the timing-control circuit devices shown in FIGS. 1 through 20. The maximum value Smax=Tdel is taken for a skew from the input signal, which is indicated by the clock signal generated from this circuit device. In this case, n indicates the number of stages for the delay element 36 of the delay controlled line 24. Tdel indicates a delay time of the delay element 36 per stage. As understood from the relationship among those items, the delay time Tdel per delay element stage must be reduced so as to reduce the skew value Smax without changing the minimum operation frequency Fmin in this timing-control circuit device. If the delay time is reduced so, the number of delay element stages n is increased. On the contrary, if the number of delay element stages n is reduced without changing the minimum operation frequency Fmin, the skew value Smax is increased. Since the area (or the power consumption) of a circuit depends on the number of delay element stages n, the skew used to indicate the performance of the object circuit device and the area (or the power consumption) takes a trade-off relationship.

Figure 26:
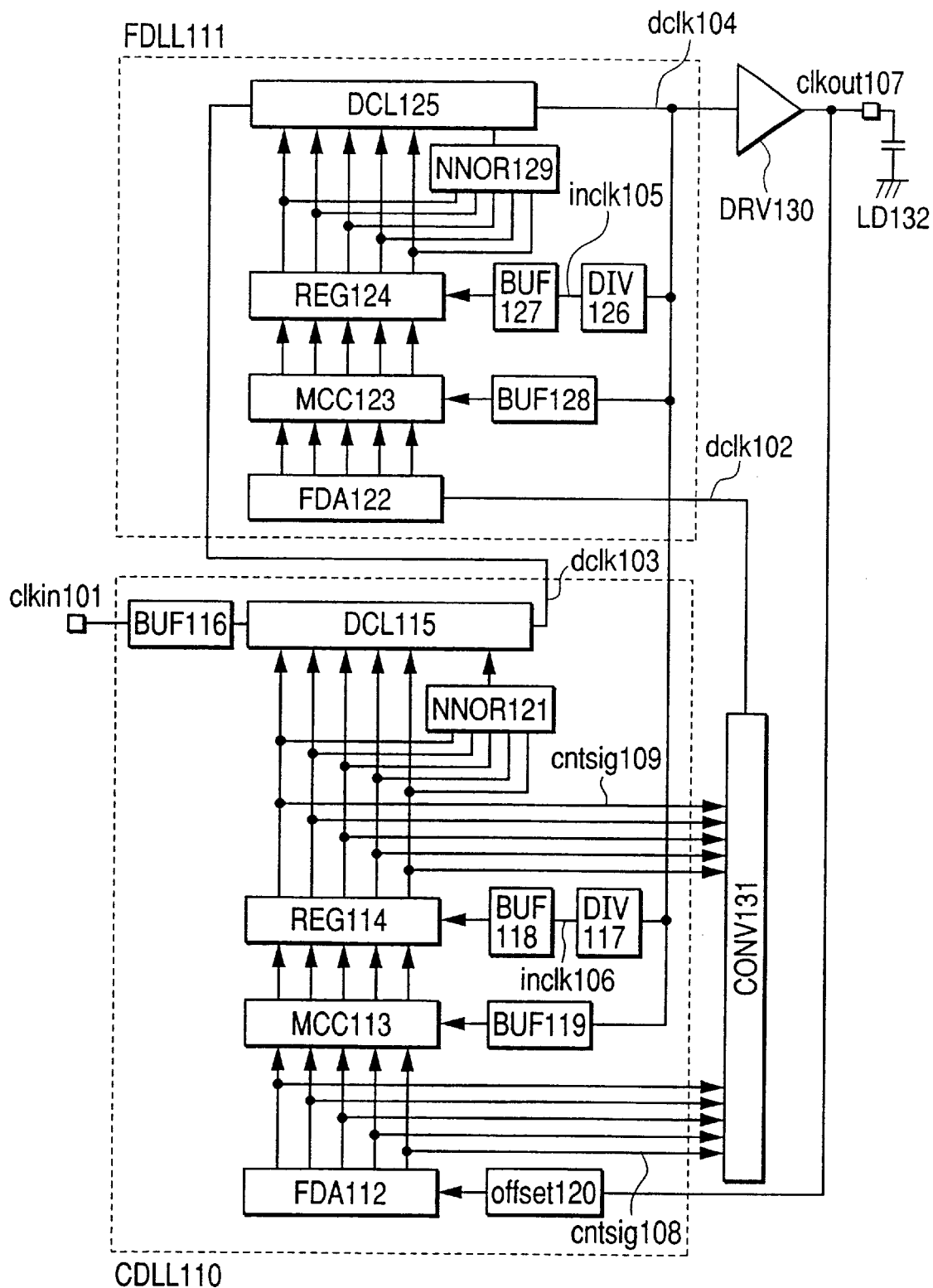
FIG. 26 is a block diagram of the sixth embodiment of the timing-control circuit device associated with the present invention.

FIG. 26 shows a principle of a configuration of the timing-control circuit device, which can reduce the skew, area, and power consumption more than each of the timing-control circuit devices shown in FIGS. 1 through 20. In the description below, it is premised that the delay time of each of the buffer, the offset circuit, the n-input NOR circuit, and the divider is smaller than the delay time of each of those items in other configurations, thereby it can be ignored for simplifying the description.

FIG. 26 shows a timing-control circuit device composed basically of a timing-control circuit in the prior stage (an coarse timing-control circuit 110), followed by another timing-control circuit in the subsequent stage (an fine timing-control circuit 111), and an coarse-fine converter 131. In particular, the delay time of the delay element of the fine timing-control circuit 111 is set smaller than that of the coarse timing-control circuit 110, thereby correcting the phase difference generated in the coarse timing-control circuit 110 using the fine timing-control circuit 111. For example, the total delay time of the delay controlled line provided in the fine timing-control circuit 111 is set equally to the delay time of the delay element in one stage in the delay controlled line provided in the coarse timing-control circuit 110. The timing-control circuit shown in FIG. 26 is composed so as to *include not only the configuration shown in FIG. 1, but also a configuration corresponding to the additional functions in FIGS. 10, 12, 13, and 17. The external clock signal clkin 101 is entered to the coarse timing-control circuit 110, thereby generating the delayed clock signal dclk 103, the control signals cntsig 108 and 109. The coarse-fine converter 131 receives the control signals cntsig 108 and 109 output from the coarse timing-control circuit 110, thereby generating the delayed clock signal dclk 102 and transferring the signal to the fine timing-control circuit 111. The fine timing-control circuit 111 receives the delayed clock signal dclk 102 and the delayed clock signal dclk 103 and generates and outputs the delayed clock signal dclk 104. The clock distribution buffer 130 receives the delayed clock signal dclk 104 and distributes a clock signal to the capacity load 132, which uses the signal as a inner clock signal clkout 107. The inner clock signal clkout 107 is fed back to the coarse timing-control circuit 110 again.

The timing-control circuit operates as described with reference to FIG. 1, etc. The external clock signal clkin 101 is entered to the delay controlled line 115 through the buffer 116. The output signal (the output signal from the multi-input NOR circuit 121 in the decided initial state) is used to control the delay time in the delay controlled line 115, thus a delayed signal is output from the delay controlled line 115 as the delayed clock signal dclk 103. The inner clock signal clkout 107 is fed back to the offset adjusting circuit 120, then entered to the forward delay circuit array 112. The forward delay circuit array 112 transfers a delayed signal to both control circuit 113 and coarse-fine converter 131. The signal is delayed at each unit delay time of the delay element composing the forward delay circuit array 112. The control circuit 113 receives the delayed clock signal dclk 104 through the external clock signal clkin 119 and transfers output signals from the delay element composing the forward delay circuit array 112 to the circuit for memorizing the clock signal 114 as a clock signal only when those output signals have a predetermined delay time respectively. The delayed clock signal dclk 104 is divided in the divider 117 and entered to the circuit for memorizing the clock signal 114 through the buffer 118 as a clock signal inclk 106. The circuit for memorizing the clock signal 114 detects and stores a position to which an output signal is output as a clock signal from the control circuit 113 according to the input timing of the clock signal inclk 106, then transfers the position to both delay controlled line 115 and coarse-fine converter 131.

According to the output signal from the circuit for memorizing the clock signal 114, the signal destination position is selected in each of the delay controlled line 115 and the coarse-fine converter 131. Delayed signal are output from the forward delay circuit array 112. The coarse-fine converter 131 selects only the signals output at the position selected in the circuit for memorizing the clock signal 114 and transfers the signals selected from the delayed signals from the forward delay circuit array 112 to a predetermined circuit as the delayed clock signal dclk 102.

The fine timing-control circuit 111 is composed just like the coarse timing-control circuit 110 and includes a delay controlled line 125, a forward delay circuit array 122, a control circuit 123, a circuit for memorising the control signal 124, buffers 127 and 128, a multi-input NOR circuit 129, and a divider 126. The delayed clock signal dclk 103 is entered to the delay controlled line 125 from the fine timing-control circuit 111 as an input clock signal. The output signal (the output signal from the multi-input NOR circuit 129 in the decided initial state) from the circuit for memorising the control signal 124 is used to control the delay time in the circuit for memorising the control signal 124, thereby a delayed signal is output from the delay controlled line 125 as the delayed clock signal dclk 104. The delayed clock signal dclk 102 from the coarse-fine converter 131 is entered to the forward delay circuit array 122. The forward delay circuit array 122 transfers a delayed signal to the control circuit 123. The signal is delayed at each unit delay time of the delay element composing the forward delay circuit array 122. The control circuit 123 receives only the signals as the delayed clock signal dclk 104 through the buffer 128, which are output from the delay element composing the forward delay circuit array 122 and have a predetermined delay time respectively. The delayed clock signal dclk 104 is then transferred to the circuit for memorising the control signal 124 as a clock signal. The delayed clock signal dclk 104 is divided in the divider 126 and entered to the circuit for memorizing the control signal 124 as a external clock signal inclk 105 through the buffer 127. The circuit for memorizing the clock signal 124 detects and stores the position to which only the clock signal selected from among the output signals from the control circuit 123 is output, according to the input timing of the external clock signal inclk 105 and transfers the position to the delay controlled line 125. According to the output signal from the circuit for memorizing the control signal 124, the position of the delay element of the delay controlled line 125 is selected.

The delay time difference between the delayed clock signal dclk 104 and the inner clock signal clkout 107 is equal to the delay time Tbuf of the clock distribution buffer 130. In the coarse timing-control circuit 110, the inner clock signal clkout 107 is entered to the forward delay circuit array 112 and the delayed clock signal dclk 104 is entered to the control circuit 113 respectively. If the clock cycle of the external clock signal clkin 101 is Tclk, the control circuit 123 detects the position of a delayed signal output from the forward delay circuit array 112, where the delay time becomes Tfda=Tin−Tbuf. Consequently, the external clock signal clkin 101 is delayed by Tdc1=Tfda=Tin−Tbuf and output as a delayed clock signal dclk 103. If this delayed clock signal dclk 102 passes through the delay controlled line 125 provided in the fine timing-control circuit 111 with no delay time at this time, the configuration in this example becomes equivalent to the configuration shown in FIG. 1. The delay time of the inner clock signal clkout 107 thus becomes Tout=Tdc1+Tbuf=Tin. In other words, the external clock signal clkin 101 is synchronized with the inner clock signal clkout 107 in phase when the external clock signal clkin 101 and another signal, which is one cycle later than the external clock signal clkin 101, are transferred to the delay controlled line 125.

However, a delay time selected actually in the delay controlled line 115 becomes a discontinued digital amount and the delay time per stage of the delay element composing the delay controlled line 115 is left as a phase error (skew) between input and output signals. This is why the fine timing-control circuit 111 is used to correct the phase error.

The coarse-fine converter 131 receives a clock signal delayed by the forward delay circuit array 112 as a control signal cntsig 108. The coarse-fine converter 131 then transfers the control signal cntsig 108 to the forward delay circuit array 122 provided in the fine timing-control circuit 111 as a delayed clock signal dclk 102. The control signal cntsig 108 is then delayed by a time according to a position where only clock signals of the signals output from the control circuit 113 provided in the circuit for memorizing the clock signal 114. The coarse-fine converter 131 also transmits the delayed clock signal dclk 103 obtained by adjusting the external clock signal clkin 101 coarsely in the delay controlled line 115 to the delay controlled line 125 provided in the fine timing-control circuit 111.

The fine timing-control circuit 111 controls the object timing just like in the coarse timing-control circuit 110, thereby fine-adjusting the delayed clock signal dclk 103 so as to obtain and output the delayed clock signal dclk 104. In this case, however, the delay time of one stage delay element composing the delay controlled line 125 provided in the fine timing-control circuit 111 is smaller than the delay time of one stage delay element composing the delay controlled line 115 provided in the coarse timing-control circuit 110. Consequently, the external clock signal clkin 101 and the inner clock signal clkout 107 can be synchronized within the delay time of one stage delay element composing the delay controlled line 125 provided in the fine timing-control circuit 111.

For example, assume now that the cycle of an external clock signal is 10 nm (frequency: 100 MHz). If the delay time of one stage delay element composing the delay controlled line 115 provided in the coarse timing-control circuit 110 is 1ns, there must be 10 delay element stages so as to synchronize this input clock signal with another signal without using any of load circuits and clock drivers. At this time, the maximum skew becomes Smax=1ns. If the delay time of one stage delay element composing the delay controlled line 125 provided in the fine timing-control circuit 111 is 100 ps, there must be 10 delay element stages. The maximum skew thus becomes Smax=100 ps. The maximum number of delay elements is 20.

On the contrary, if 20 delay element stages are used just like in FIG. 26 while a 10 ns input clock signal is to be synchronized with other clock signals in the one-stage timing-control circuit device as shown in FIG. 1, the maximum skew is increased to −Smax=500 ps. If an attempt is made to realize a maximum skew of Smax=100 ps in this case, there must be 100 stages of 1ns delay elements. The size and power consumption of the circuit will thus be increased. If the circuit in this embodiment is used, however, it is possible to reduce the skew, as well as the circuit size, area, and power consumption thereof while the same characteristics as those of the timing-control circuit device shown in FIG. 1 are kept.

Figure 28A:
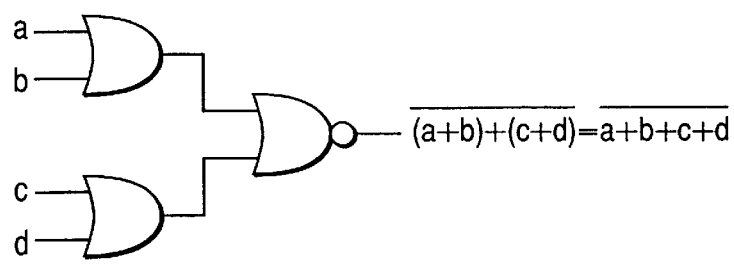
FIG. 28(*a*) is a circuit diagram for an embodiment of an n-input NOR circuit and FIG. 28(*b*) is a circuit diagram for another embodiment of the n-input NOR circuit.
Figure 28B:
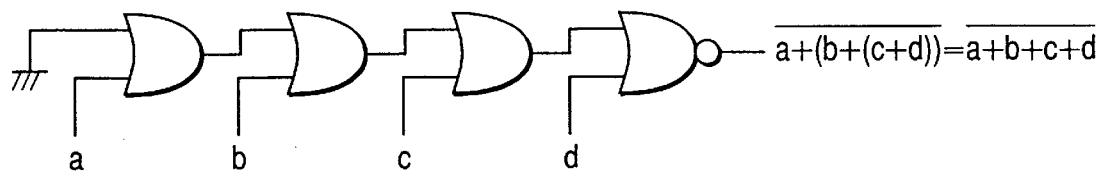
Figure 27:
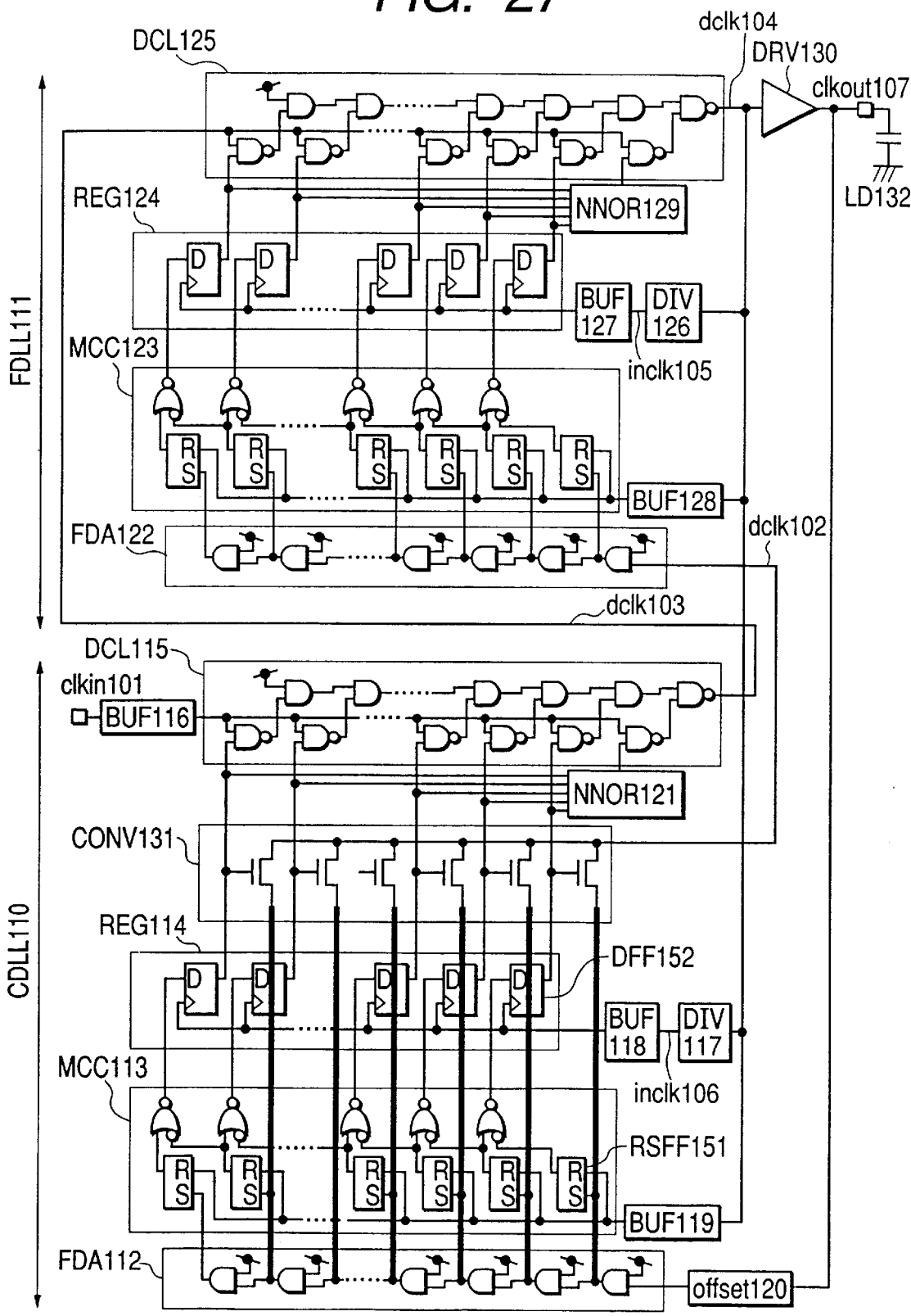
FIG. 27 is concrete logical circuit diagrams of timing-control circuits CDLL 110 and FDLL 111.
Figure 29A:
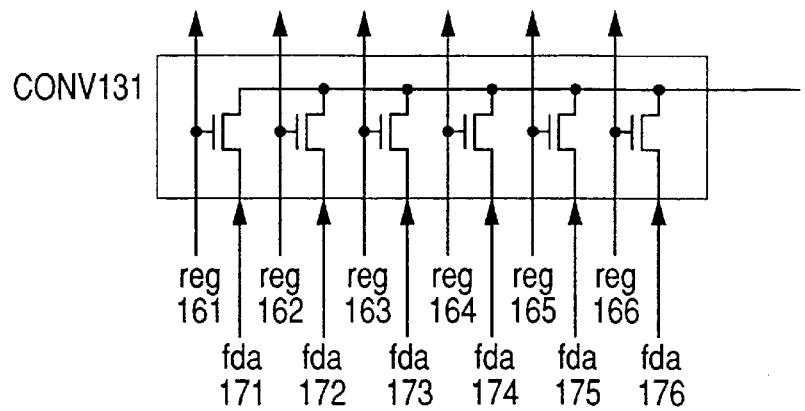
FIG. 29(*a*) is a circuit diagram of a coarse-fine adjustment converting circuit and FIG. 29(*b*) is a circuit diagram of another embodiment of the coarse-fine converter.
Figure 29B:
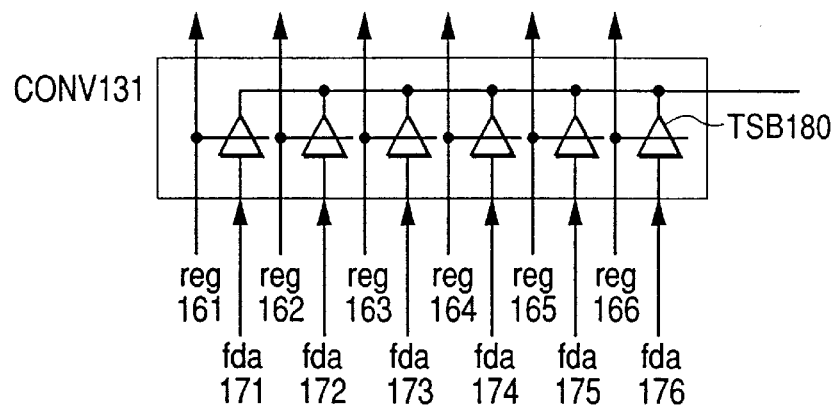
Figure 30:
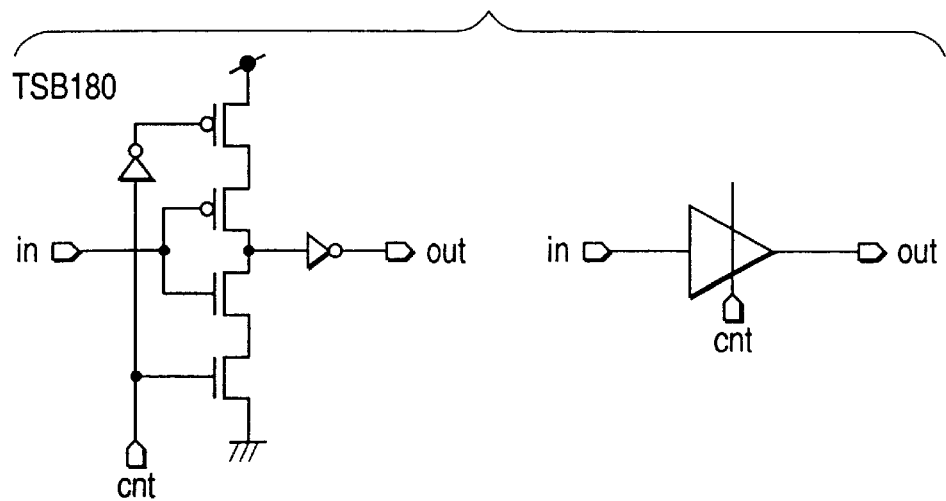
FIG. 30 shows an embodiment of a tri-state buffer circuit.

FIG. 27 shows a concrete logic circuit diagram of the timing-control circuit device shown in FIG. 26. Description for the same items as those shown in FIG. 3 will be omitted here. The multi-input NOR circuits 121 and 129 of the coarse timing-control circuit 110 and the fine timing-control circuit 111 are composed as shown in FIG. 28(a) and FIG. 28(b). In the configuration shown in FIG. 28(b), the delay time is increased, but an OR circuit can be disposed at each output of the circuits for memorizing the clock signal 114 and 124. Thus, it is easier to dispose the NOR circuits when in designing. In addition, the layout area can be reduced. In FIG. 28(b), a NOR circuit has four inputs. If the number of inputs is n in the NOR circuit, the OR circuit in the n−1 stage and the NOR circuit in the last stage can be used for the same connection as the above so as to compose an n-input NOR circuit, The coarse-fine converter 131, as shown in FIG. 29(a) (FIG. 27), can be composed of switches, each of which uses a MOS transistor or composed of a tri-state buffer as shown in FIG. 29(b). In the configuration shown in FIG. 29(b), it is possible to reduce the load to be applied to each of the delayed signals fda 171 to 176 from the forward delay circuit array 112. FIG. 30 shows a configuration of the tri-state buffer 180.

For example, if the signal reg 161 is selected from among the signals output from the circuit for memorizing the control signal 114, the delayed clock signal fda 171 selected from among the signals output from the forward delay circuit array 112 becomes a delayed clock signal, which is equivalent to the delayed clock signal dclk 102 shown in FIG. 27 and it is transmitted to the fine timing-control circuit 111 from the coarse timing-control circuit 110 through the coarse-fine converter 131. At this time, if a switch shown in FIG. 29(a) is used, the delayed clock signal fda 171 is connected directly to the forward delay circuit array 112 provided in the fine timing-control circuit 111 through the NMOS switch. Thus, the entire drain capacity of the switching NMOS is applied as a load to the output of the AND circuit composing the forward delay circuit array 112 provided in the coarse timing-control circuit 110. Consequently, a delay time is generated in the signal waveform. If a switching circuit shown in FIG. 29(b) is used, the output load of the AND circuit in the forward delay circuit array 112 is applied only to the gate of the tri-state buffer composing the switching circuit. The load capacity can thus be reduced.

Figure 31:
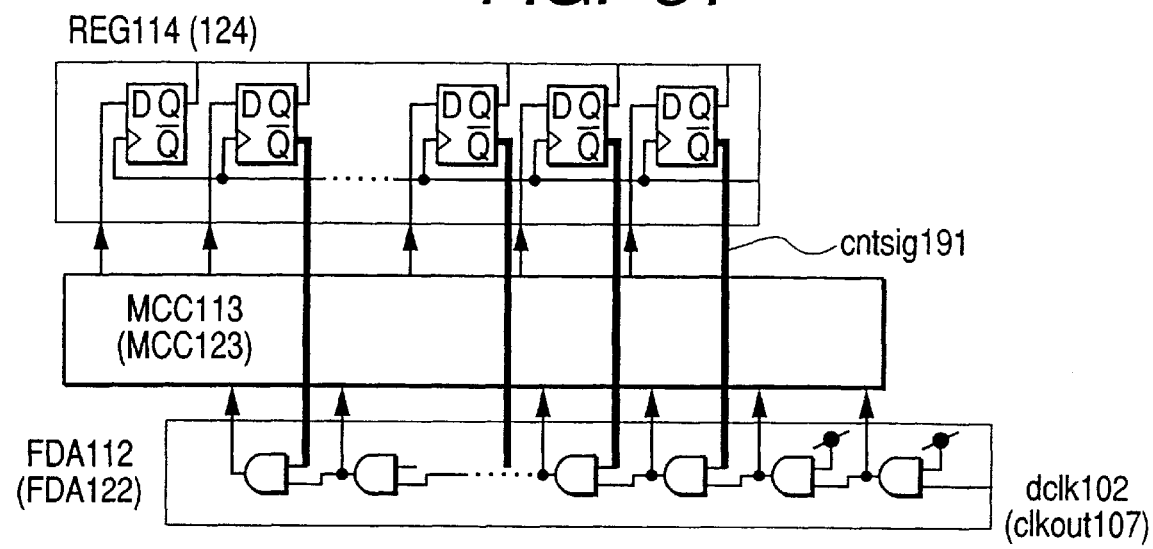
FIG. 31 is a block diagram of the seventh embodiment of the timing-control circuit device associated with the present invention.

FIG. 31 shows variations of the forward delay circuit array 112(122), as well as the timing-control circuit 141 (142). The /Q output cntsig 191 of the flip-flop circuit composing a control signal storing circuit is connected to an input of an AND circuit composing a forward delay circuit array. In this case, no clock signal is transmitted to the AND circuits in the forward delay circuit array in the subsequent stage (the left stage in FIG. 31) beyond the position selected by the circuit for memorizing the control signal. Consequently, it is possible to reduce the operation power consumption.

Figure 32:
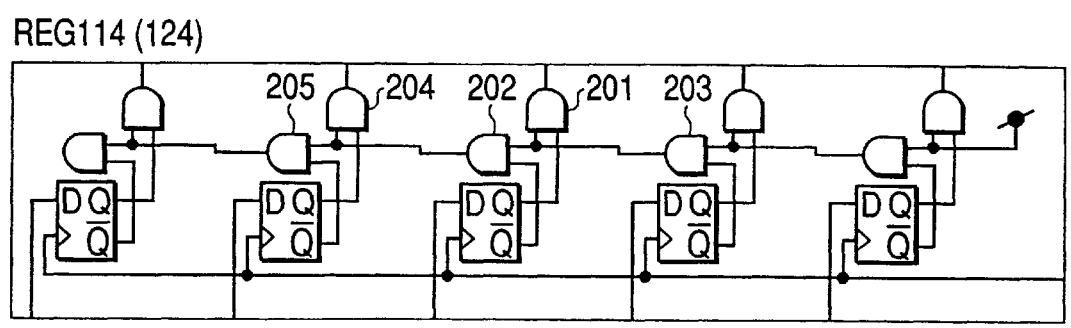
FIG. 32 is a block diagram of the eighth embodiment of the timing-control circuit device associated with the present invention.

FIG. 32 shows a variation of the circuit for memorizing the clock signal 114(124). As shown in FIG. 32, an AND circuit is composed at the output of each D-type flip-flop circuit composing a circuit for memorizing the control signal. In other words, two AND circuits (the first AND circuit 201 and the second AND circuit 202) are provided for each D-type flip-flop circuit. The first AND circuit 201 receives an input consisting of the Q output from the D-type flip-flop circuit and the output from the second AND circuit 203 in the prior stage (the right stage in FIG. 31). The output of the first AND circuit 201 is then entered to the circuit for memorizing the control signal. The second AND circuit receives an input consisting of the /Q output from the D-type flip-flop circuit and the output from the second AND circuit 203 in the prior stage (the right stage in FIG. 31). The output of the AND circuit is then entered to both first AND circuit 204 and second AND circuit 205. With this configuration, if a given D-type flip-flop is selected, all the other D-type flip-flop circuits located beyond that are not selected. Consequently, it is prevented that two circuits for memorizing the control signal are selected simultaneously. If two circuits are selected, two positions are selected in the delay controlled line 115 (125), thereby the synchronization is lost and a through-current will flow in the circuit. And, this must be prevented.

Figure 33:
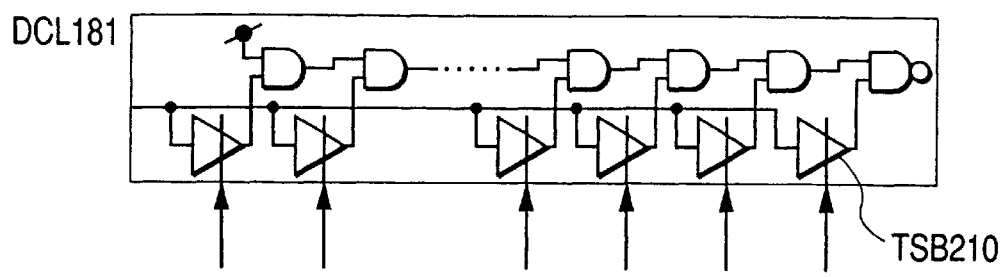
FIG. 33 is a block diagram of the ninth embodiment of the timing-control circuit device associated with the present invention.

FIG. 33 shows a variation of the delay controlled line 115 (125). The delay controlled line shown in FIG. 27 is composed of an AND circuit delay array and NAND selectors. A selector composed of a NAND circuit such way can arise a hazard when delay element positions are changed. If such a hazard occurred-waveform is output as a inner clock signal clkout 107, a clock signal supplied circuit might malfunction. FIG. 34 shows a timing chart for the relationship among clock signals. FIG. 34(a) and (b) show a selector composed of a NAND circuit and a selector composed of a tri-state buffer respectively. If the external clock signal inclk 105 generates a rising edge and delay element positions are changed there while the external clock signal cikin 101 is on the high level as shown in the timing chart in FIG. 34(a), a hazard occurs in the inner clock signal clkout 107. No hazard occurs, however, even when the external clock signal inclk 105 generates a rising edge while the external clock signal inclk 105 is on the low level as shown in FIG. 34(b). And if a selector circuit is composed of a tri-state buffer 210 as shown in FIG. 33, the output of the tri-state buffer is kept in the previous state in a period in which a hazard occurs with the AND circuit. This is why no hazard occurs as shown in FIG. 34(c) and (d).

Figure 35A:
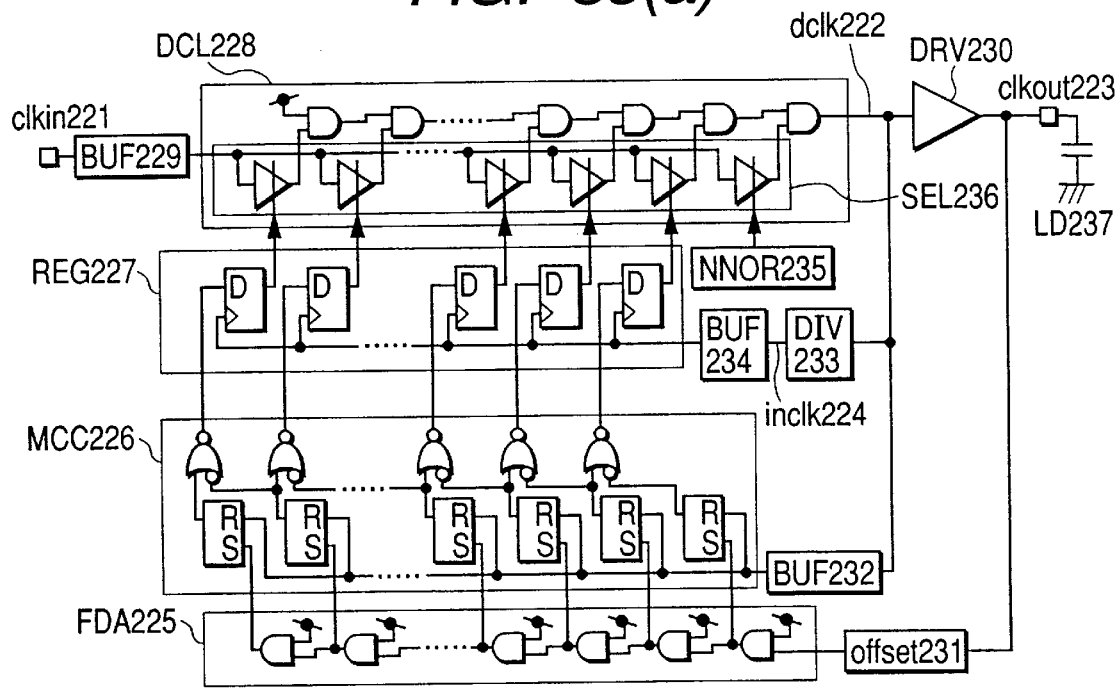
FIG. 35 is a block diagram of the tenth embodiment of the timing-control circuit device associated with the present invention.
Figure 35B:
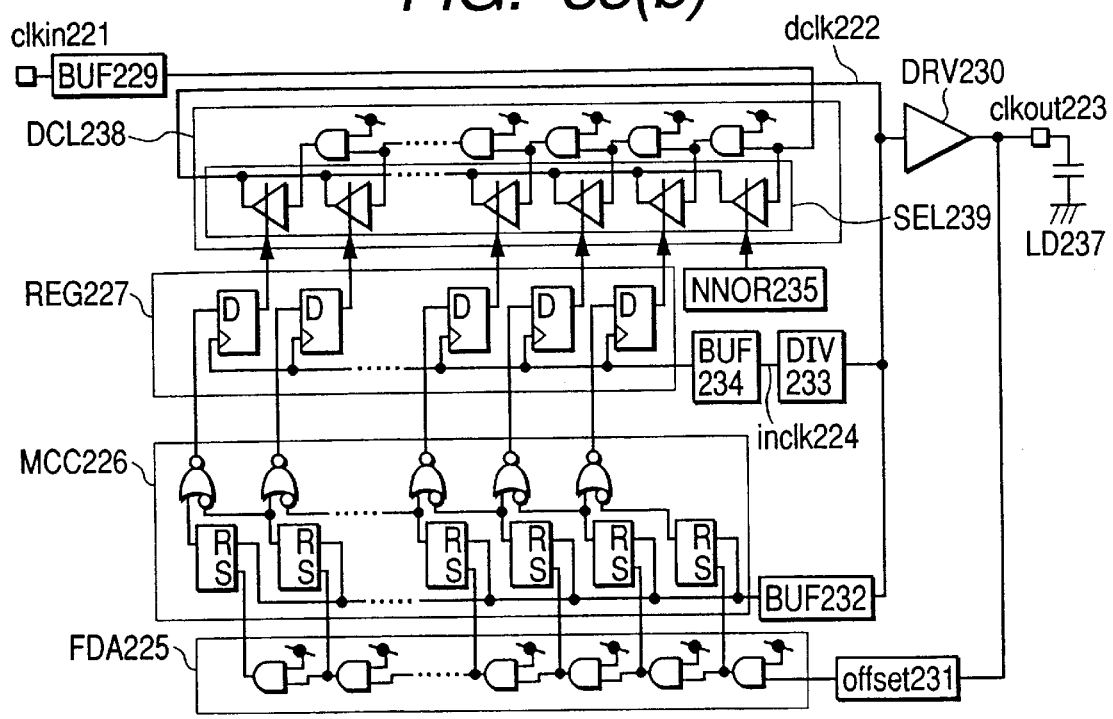

FIG. 35 shows another variation of the delay controlled line 115(125). In the timing-control circuit device composed as shown in FIG. 35(a), the external clock signal clkin 221 is transmitted to a delay element array composed of AND circuits from the position detected by the circuit for memorizing the clock signal 227 through a selector 236 composed of a tri-state buffer in the delay control circuit 228. The external clock signal clkin 221 becomes a delayed clock signal dclk 222. This signal is then divided in the divider 233 and becomes a clock signal inclk 224. In this case, the relationship between the timing of the clock signal transmitted to the selector 236 and the timing at which the output of the circuit for memorizing the control signal 227 is decided by the clock signal inclk 224 is changed according to the selected position of the selecter 236. The relationship thus becomes undefined, and accordingly such a problem as a hazard might occur just like in the configuration shown in FIG. 34.

To avoid this problem, therefore, the circuit for memorizing the delay controlled line 238 should be composed as shown in FIG. 33(*b*). In the circuit for memorizing the delay controlled line 238, a delay array composed of an AND circuit receives the external clock signal clkin 221 and other clock signals and outputs the delayed clock signal dclk 222 through the circuit for memorizing the selector 239 composed of a tri-state buffer when the selected position of the selector is reached. In this case, almost no difference is generated between the timing with which the circuit for memorizing the selector 239 is selected and the clock signal is transmitted to the circuit for memorizing the clock distribution buffer 230 and the timing at which the divider 233 generates the clock signal inclk 224, so the relationship among timings can be determined.

The variations shown in FIG. 28 and FIGS. 31 through 35 can be evidently usable for the timing-control circuit device composed basically as shown in FIG. 1, as well as for the timing-control circuit device composed basically as shown in FIG. 26.

Figure 36:
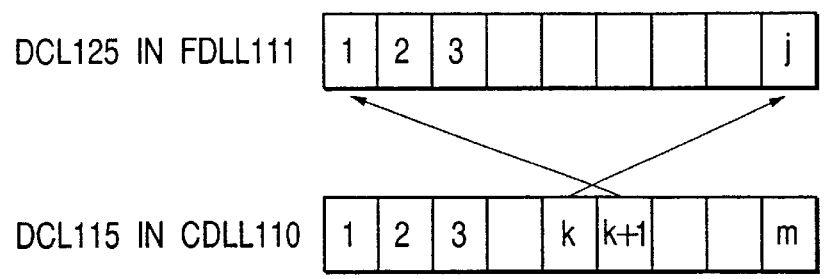
FIG. 36 shows a conceptual block diagram of the eleventh embodiment of the timing-control circuit device associated with the present invention.

Hereunder, description will be made for the timing-control circuit device shown in FIG. 36, which is composed so as to prevent a skew caused by a change of the synchronization timing in the coarse timing-control circuit. In this case, it is premised that the delay controlled line 115 provided in the coarse timing-control circuit 110 is composed of m stages of delay elements and the delay controlled line 125 provided in the fine timing-control circuit 111 is composed of j stages of delay elements. It is also premised that the delay element in the k-th stage and the delay element in the 1st stage are selected in the delay controlled line 115 and delay controlled line 125 respectively for synchronization when the device starts an operating. If the delay time of such a load circuit as a clock driver is changed due to a temperature rise during the operation, the delay element to be selected in the delay controlled line 125 is shifted from the first to the second, and further to the third. Finally, the delay element is shifted to the j-th one in the delay controlled line 125. And, if the delay element to be selected is further to be shifted, the delay element must be shifted up from the k-th stage to the K+1st stage in the delay controlled line 115. If the delay element is kept positioned in the j-th stage in the delay controlled line 125 at this time, the delay time for one delay element in the delay controlled line 115 appears as a skew. In order to avoid this, therefore, a delay element is selected forcibly in the delay controlled line 125 when the selected position is shifted in the delay controlled line 115. For example, if the delay element in the delay controlled line 115 is shifted up from the k-th stage to the k+1 stage, the 1st delay element is selected forcibly in the delay controlled line 125 and if the delay element in the delay controlled line 115 is shifted down from the k+1 stage to the k stage, the delay element in the j stage is selected forcibly in the delay controlled line 125.

Figure 37:
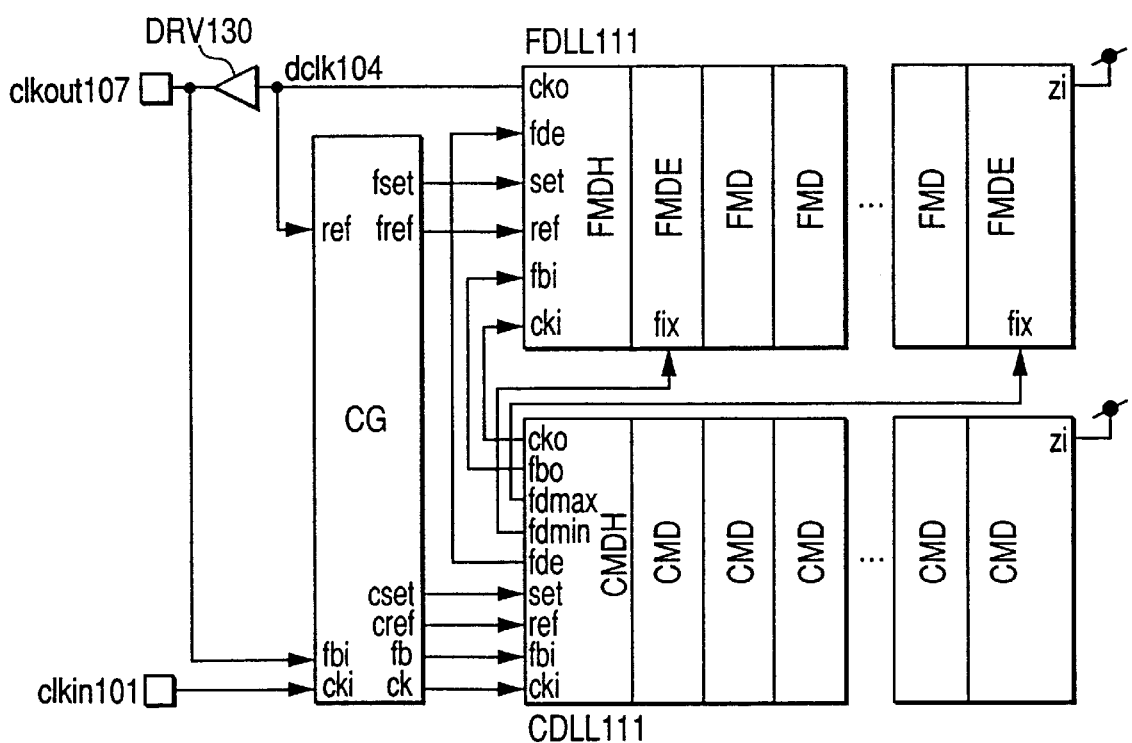
FIG. 37 is a block diagram of the eleventh embodiment of the timing-control circuit device associated with the present invention.
Figure 40:
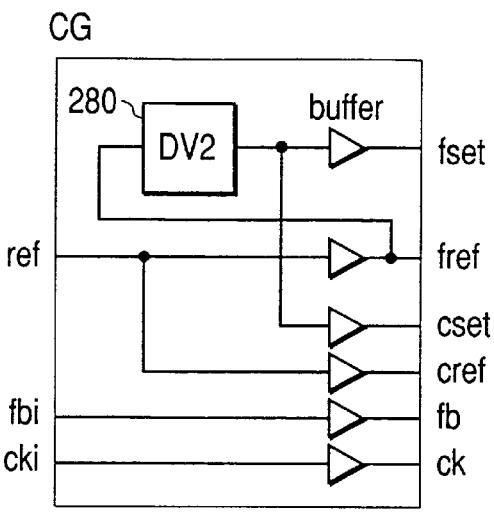
FIG. 40 is a block diagram of a CG circuit in an embodiment.
Figure 41:
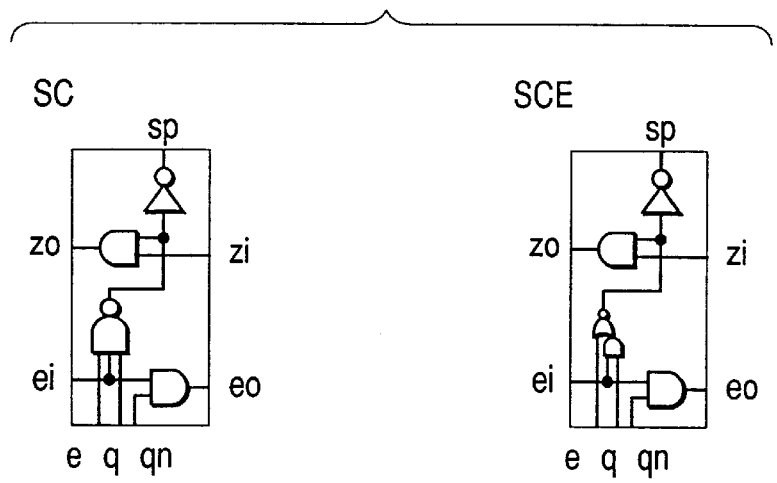
FIG. 41 is a block diagram of SC and SCE circuits in an embodiment respectively.
Figure 42:
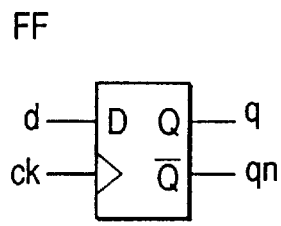
FIG. 42 is a block diagram of an FF circuit.

The timing-control circuit device shown in FIG. 37 employs all the functions described with reference to FIG. 26 and the device includes a CG circuit, a CMDH circuit, a CMD circuit, an EMDH circuit, an FMD circuit, an FADE circuit, and a clock driver circuit 256. Each component in this embodiment is described just as a layout unit respectively. Since each of the forward delay circuit array, the control circuit, the circuit for memorizing the control signal, the delay controlled line, and the coarse (fine) adjustment converter in the coarse-fine timing-control circuit is composed of the same number of elements respectively, the delay elements, flip-flop circuits, etc. corresponding to each of those components are grouped in one block. The CG circuit (FIG. 40) is a block equivalent to a divider or a buffer. The divider 280 is used commonly for both of the coarse timing-control circuit and the fine adjustment control circuit, so that divided clock signals inclk 105 and 106 are output from the fset and cset terminals respectively. The external clock signal clkin 101 is entered to the cki terminal, the inner clock signal clkout 107 is entered to the fbi terminal, and the delayed clock signal dclk 104 is entered to the ref terminal respectively.

The CMDH circuit and the CMD circuit (FIG. 39) are combined to compose the coarse adjustment control circuit and the EMDH circuit, the FMD circuit, and the FMDE circuit (FIG. 38) are combined to compose the fine timing-control circuit. Signals are transmitted from the CG circuit to the CMDH circuit as follows; the signal (inclk 105) from the fset terminal is transmitted to the set terminal and the signal (dclk 104) from the fref terminal is transmitted to the ref terminal respectively, as well as the signal (inclk 106) is transmitted to the set terminal, the signal (dclk 104) is transmitted to the ref terminal, the signal (clkout 107) from the fb terminal is transmitted to the fbi terminal, and the signal (clkin 101) from the ck terminal is transmitted to the cki terminal.

The signals from the CMDH circuit are transmitted to the EMDH circuit as follows; the signal (dclk 103) from the cko terminal is transmitted to the cki terminal, the signal (dclk 102) from the fbo terminal is transmitted to the fbi terminal, and the signal from the fde terminal is transmitted to the fde terminal respectively.

Each of the signals fdmax, fdmin, and fix generated in the FMDE, CMD, and CMDH circuits are associated with the functions described with reference to FIG. 36. If the delay element in the delay controlled line 115 (the delay element in the CMD circuit shown in FIG. 37) is shifted up/down, the delay element in the delay controlled line 125 (the delay element in the EMD circuit shown in FIG. 37) is also shifted up/down forcibly.

If the delay element in the delay controlled line 115 is shifted up by one stage, that is, if the CMD circuit positioned one stage to the right side is selected, the cdinc signal of the CMD circuit (FIG. 39) is activated and the fdmin signal is activated in the CDMH. In the delay controlled line 125, the fdmin signal is entered to the first on this side in FIG. 37, that is the EMDE circuit positioned at the left end, so that the FMDE circuit is validated. At this time, other EMD circuits are invalidated. In the same way, if the delay element in the delay controlled line 115 is shifted down by one stage, that is, if the CMD circuit positioned at the left end is selected, the cddec signal of the CMD circuit (FIG. 39) is activated, so that the fdmax signal is activated in the CMDH circuit. In the delay controlled line 125, the fdmax signal is entered to the FMDE circuit positioned at the last subsequent stage, that is, at the right end, so that the FMDE circuit is validated. With the above operations, the delay time in the delay controlled line in the fine adjustment control circuit can be suppressed even when the selecting position is changed in the delay control circuit in the coarse timing-control circuit.

Figure 39:
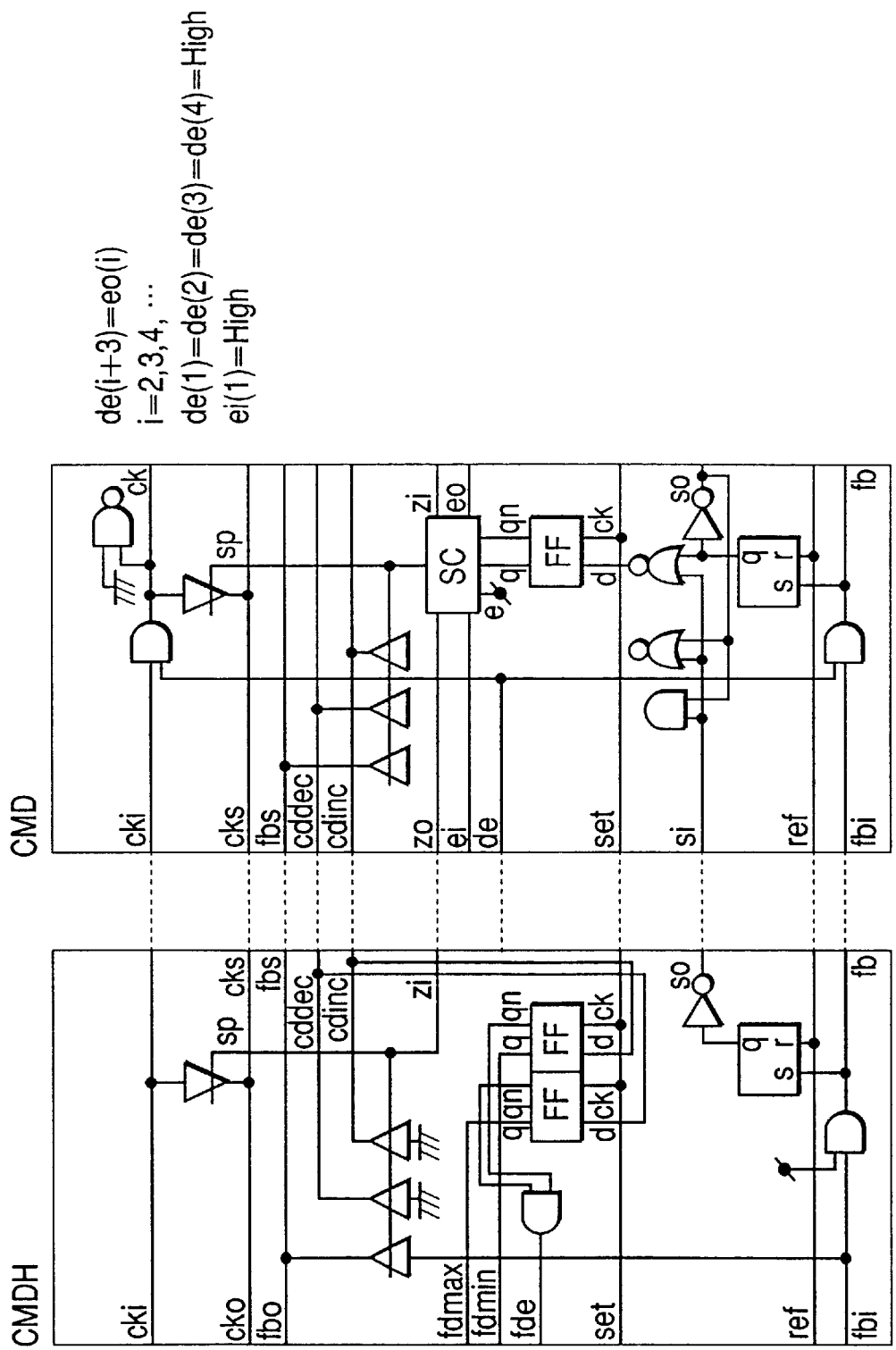
FIG. 39 is block diagrams of CMDH and CMD circuits.

The terminals are connected between the CMDH and CMD circuits as shown in FIG. 39. The terminals are also connected between the CMD circuits in the same way. In this case, however, it is premised that the ei terminal is connected to the eo terminal, and the terminals are connected so as to satisfy the conditions of de(i+3)=eo(i), de(1)=de(2)=de(3)=de(4)=HIGH, and ei(1)=HIGH at i=2, 3, 4, . . . This is to realize the functions shown in FIG. 31. In the CMD circuit positioned at the right end, the zi terminal is connected to HIGH (power supply) and other output terminals are set to floating.

Figure 38:
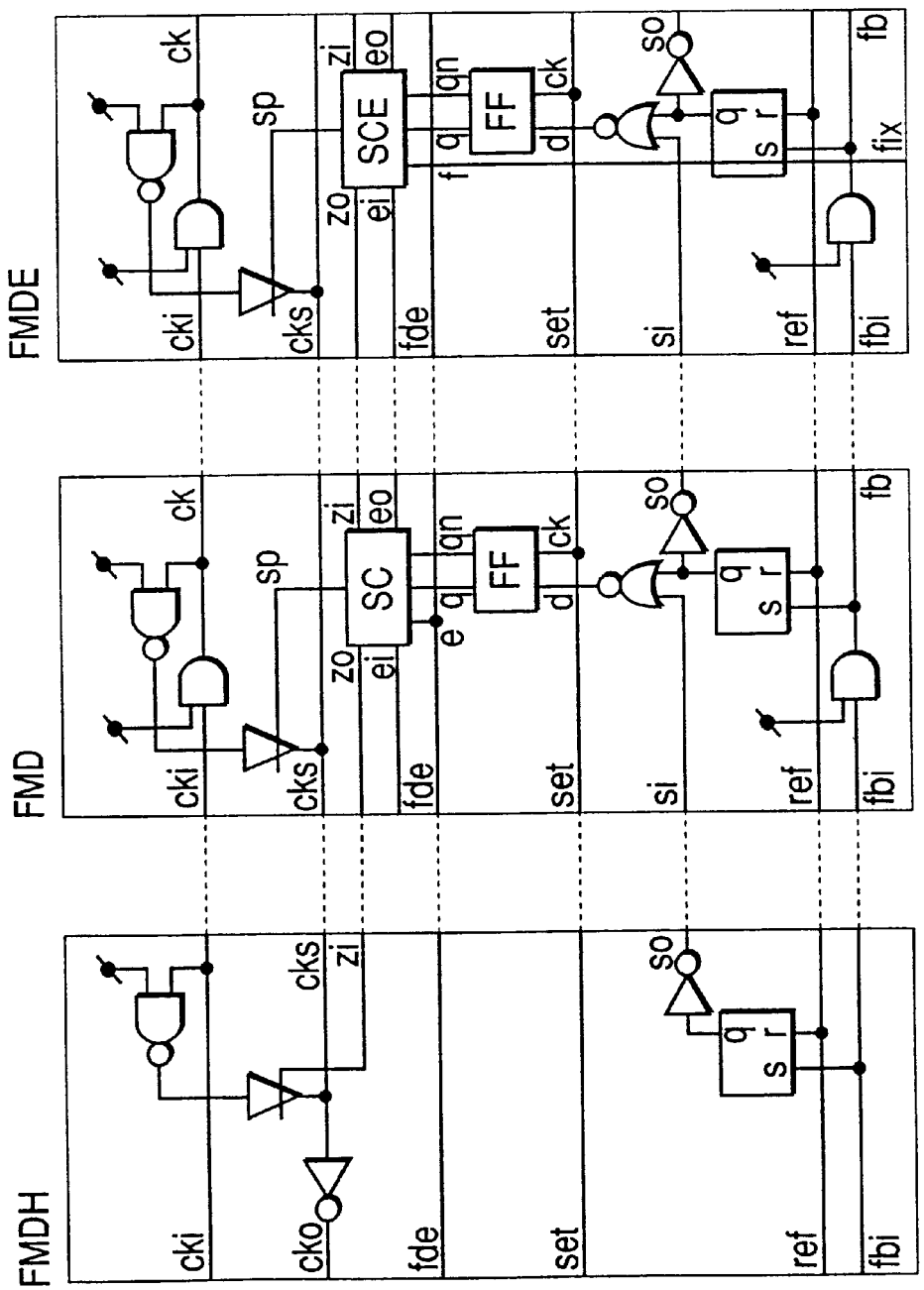
FIG. 38 is block diagrams of FMDH, FMD, and EMDE circuits.

Between an FMDH circuit and an EMDE circuit, the terminals are connected to each other as shown in FIG. 38. Between an M[]DE circuit and an FMD circuit, as well as between FMD circuits, the terminals are connected to each other in the same way. In the right end FMDE circuit, the zi terminal is connected to HIGH (power supply) and other output terminals are set to floating. The delayed clock signal dclk 104 from the cko terminal in the FMDH circuit is entered to the ref terminal in both clock distribution buffer 130 and CG circuit. The clock distribution buffer 130 delays the delayed clock signal dclk 140 and outputs the delayed signal as a inner clock signal clkout 107, which is then fed back to the fbi terminal of the CG circuit.

Figure 43:
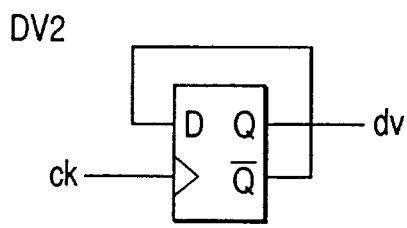
FIG. 43 is a block diagram of a DV2 circuit.
Figure 44:
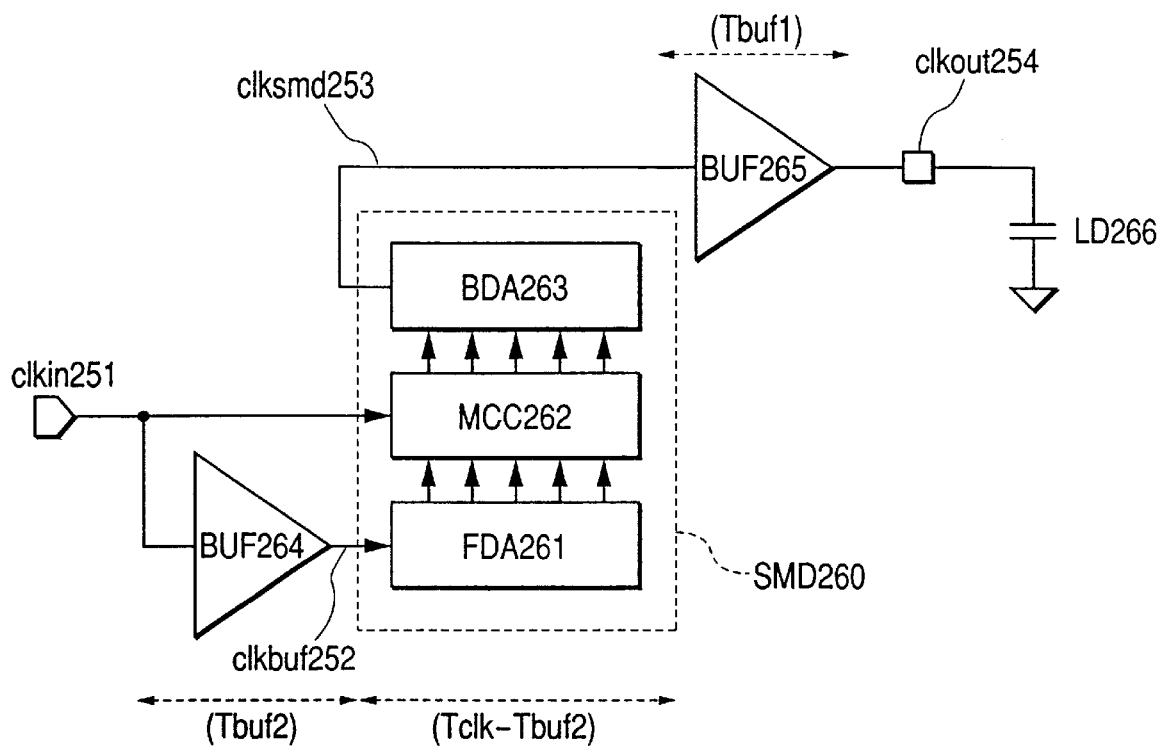
FIG. 44 is a block diagram of a synchronous mirror delay circuit in an embodiment.
Figure 45:
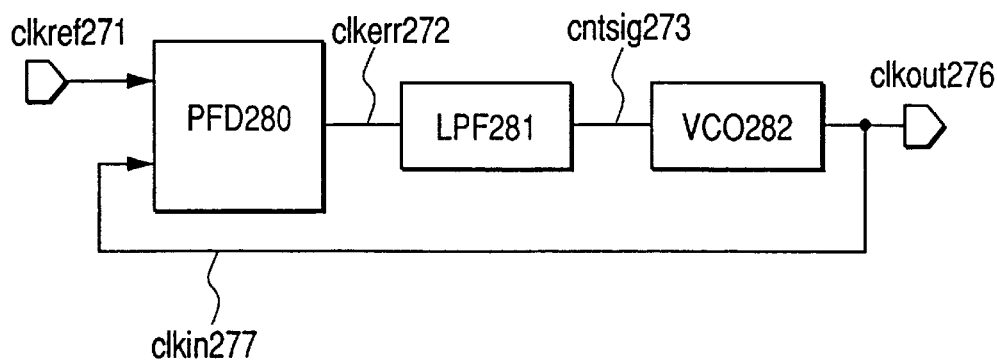
FIG. 45 is a block diagram of a phase synchronization loop circuit in an embodiment.

The divider provided in the CG circuit divides a clock frequency to a half in FIG. 43, but it can be a divider for dividing a clock frequency to ⅓ or ¼. If a ½ divider is provided in the CG circuit, two cycles are needed respectively in both coarse and fine adjustment control circuits (4 cycles in total) so as to stabilize the output signal from the timing-control circuit device. In the same way, if a ⅓ divider is used, three cycles are needed respectively in both coarse and fine adjustment control circuits (6 cycles in total) so as to stabilize the output signal from the timing-control circuit device. The number of delay element stages in each of the coarse and fine adjustment control circuits is decided by such required specifications as the minimum operation frequency, the unit delay time of each delay element, the maximum skew, etc.

While the present invention has been described in conjunction with the above preferred embodiments concretely, various modifications will be enabled by this disclosure as long as they are still within the scope and spirit of the invention.

For example, the circuit shown in FIG. 2 can be composed of one semiconductor integrated circuit such as a synchronous DRAM, a synchronous SRAM, etc. In addition, each of the semiconductor integrated circuits LSI111, LSI121, LSI131, etc. can be composed of a microcomputer, a microprocessor, or a data processor. In addition, each of the external semiconductor integrated circuits 92 to 94 can not be a DRAM; it can be changed to another semiconductor integrated circuit operated synchronously with a clock signal.

Each of the timing-control circuits shown in FIGS. 26 through 43 can be used as any of the clock distribution systems shown in FIGS. 21 to 25, of course, just like any of the timing-control circuits shown in FIGS. 1 through 20.

Hereunder, the effects of the present invention, which are obtained from the representative embodiments, will be described briefly.

In a timing-control circuit for generating an internal clock synchronized with an external clock, the control circuit has characteristics of a synchronous mirror delay circuit, which enables the synchronous clock to be stabilized quickly. In addition, the control circuit can supply such a synchronous signal without depending on any load caused by an output buffer for the clock signals, etc. Consequently, a clock distribution buffer can be designed even when it is unknown. And, even when the load of the designed clock distribution buffer is changed, the control circuit can cope with such a change. The control circuit can also cope with a characteristic change of any load circuit caused by a manufacturing process variation, temperature change, etc. In addition, if the timing-control circuit of the present invention is used to supply a clock outside a semiconductor integrated circuit, the clock signal can be generated so as to keep synchronization with the clock signal inside the semiconductor integrated circuit even when a load circuit device, which needs a clock signal outside the semiconductor integrated circuit, is replaced.

While the present invention has been described above in conjunction with the preferred embodiments, one of ordinary skill in the art would be enabled by this disclosure to make various modifications to this embodiment and still be within the scope and spirit of the invention as defined in the appended claims.

What is claimed is:

1. A timing-control circuit device comprising:
    a logic circuit for receiving a first transfer signal and outputting a second transfer signal; and
    a load for receiving said second transfer signal and outputting a third transfer signal;
    wherein said third transfer signal is fed back to said logic circuit, thereby generating said second transfer signal so as to synchronize the phase of said first transfer signal with the phase of said third transfer signal, and
    said logic circuit is composed of a first delay circuit array for detecting a phase difference between said third transfer signal and said second transfer signal and generating a control signal according to said detected phase difference; and a second delay circuit array for enabling a delay time of said third transfer signal to be changed with respect to said first transfer signal according to said control signal.

2. A timing-control circuit device in accordance with claim 1,
    wherein said first delay circuit array includes a forward delay circuit for enabling a delayed signal to be output from a plurality of positions in a delay path respectively while transferring said third signal with a predetermined delay in a single direction; and a detecting circuit for generating a plurality of control signals according to a phase difference between each of said delayed signals output from said forward delay circuit and said second transfer signal so that a control signal included in a plurality of said generated control signals and regarded not to have said phase difference indicates an output position of said delayed signal corresponding to itself so as to be distinguished from the output postions of other delayed signals;
    wherein said second delay circuit array receives a plurality of said control signals and generating said second transfer signal by giving a delay to said first transfer signal corresponding to the delay time of said third transfer signal in said forward delay circuit in a section up to said output position indicated by said control signal so as to be distinguished from the output positions of other delayed signals.

3. A timing-control circuit device in accordance with claim 2,
    wherein said first and third transfer signals are synchronous pulse signals having a fixed cycle respectively, and said third transfer signal is synchronized with said first transfer signal in phase with a delay of the predetermined number of pulses.

4. A timing-control circuit device in accordance with claim 3,
wherein said timing-control circuit device further includes a register for latching a control signal output from said control circuit synchronously with the cycle of said second transfer signal and supplying said latched control signal to said second delay circuit array.

5. A timing-control circuit device in accordance with claim 3,
wherein said timing-control circuit device further includes a divider for receiving said second transfer signal and outputting a divided signal; a buffer for giving a given delay time to an output signal from said divider; and a register for latching a control signal output from said control circuit synchronously with the cycle of a signal output from said buffer, then supplying said latched control signal to said second delay circuit array.

6. A timing-control circuit device in accordance with claim 1,
wherein said second transfer signal is fed back to said timing-control circuit device via said load as said third transfer signal, and said first transfer signal is synchronized in phase with said third transfer signal even when a delay time of said second transfer signal from said third transfer signal is changed due to a static or dynamic change of said load.

7. A timing-control circuit device in accordance with claim 4,
wherein said timing-control circuit device further includes first to third signal distribution circuits, and said first signal distribution circuit receives said first transfer signal and supplies a distribution signal to said second delay circuit array, said second distribution circuit receives said second transfer signal and supplies a distribution signal to said control circuit, and said third signal distribution circuit receives said second transfer signal and supplies a distribution signal to said storing circuit.

8. A timing-control circuit device in accordance with claim 3,
wherein a plurality of said control signals are set on first level while said third transfer signal is not synchronized in phase with said first transfer signal, and any of said control signals, which is regarded not to have a phase difference, is set on second level when said third transfer signal is synchronized with said transfer signal, and in such a situation, said timing-control circuit device further includes a gate circuit, which generates a pseudo control signal on pseudo second level when all of said plural control signals are set on first level so that at least one of said control signals is set on said first level, thereby said pseudo control signal is set on said first level, and
said second delay circuit array receives said pseudo control signal and outputs said first transfer signal as said second transfer signal corresponding to said second level of said pseudo control signal.

9. A timing-control device in accordance with claim 1,
wherein said load enables said second transfer signal to be branched in a plurality of buffers and distributed to a plurality of loads, and
a signal distributed to each of said plural loads is regarded to be said third transfer signal.

10. A clock distribution system including:
a semiconductor integrated circuit provided with a timing-control circuit, a clock generator, and a clock distributor, as well as a load connected to said semiconductor integrated circuit,
wherein said clock generator generates a fourth clock signal;
wherein said clock distributor includes a plurality of buffers and a plurality of internal loads, said fourth clock signal being branched in said plurality of buffers and each of said internal loads operating synchronously with each of branched fourth clock signals,
wherein said timing-control circuit receives a first clock signal that is one of said branched fourth clock signals and a third clock signal and outputs a second clock signal outside said semiconductor integrated circuit so as to be fed back as said third clock signal via said load, thereby generating said second clock signal so as to synchronize said first clock signal in phase with said third clock signal, and
wherein said timing-control circuit includes a first delay circuit array, which detects a phase difference between said third clock signal and said second clock signal and outputs a control signal according to said detected phase difference; and a second delay circuit array, which can change the delay time of said third clock signal with respect to said first clock signal according to said control signal.

11. A clock distribution system in accordance with claim 10,
wherein said first delay circuit array includes a forward delay circuit for enabling a delayed signal to be output from a plurality of positions in a delay path respectively while transferring said third signal with a predetermined delay in a single direction; and a detecting circuit for generating a plurality of control signals according to a phase difference between each of said delayed signals output from said forward delay circuit and said second transfer signal so that a control signal included in a plurality of said generated control signals and regarded not to have said phase difference indicates the output position of said delayed signal corresponding to itself so as to be distinguished from the output positions of other delayed signals;
wherein said second delay circuit array receives a plurality of said control signals and generating said second transfer signal by giving a delay to said first transfer signal corresponding to a delay time of said third transfer signal in said forward delay circuit in a section up to said output position indicated by said control signal so as to be distinguished from the output positions of other delayed signals.

12. A clock signal distribution system in accordance with claim 10,
wherein said second clock signal is fed back directly to said timing-control circuit as a third clock signal in said semiconductor integrated circuit.

13. A clock distribution system including:
a first semiconductor integrated circuit provided with a timing-control circuit; and
a second semiconductor integrated circuit operating synchronously with a clock signal;
wherein said timing-control circuit receives a first clock signal generated in said first semiconductor integrated circuit and a third clock signal supplied from outside said semiconductor integrated circuit and outputs a second clock signal so that said second clock signal is supplied from said first semiconductor integrated circuit to said second semiconductor integrated circuit, then fed back to said first semiconductor integrated circuit as said third clock signal, thereby said second clock signal is generated so as to synchronize said first clock signal in phase with said third clock signal, and wherein said timing-control circuit comprises a first delay circuit array for detecting a phase difference between said third clock signal and said second clock signal and generating a control signal according to said detected phase difference; and a second delay circuit array, which can change a delay time of said third clock signal with respect to said first clock signal according to said control signal.

14. A clock distribution system in accordance with claim 13, wherein said first delay circuit array includes a forward delay circuit for enabling a delayed signal to be output from a plurality of positions in a delay path respectively while transferring said third signal with a predetermined delay in a single direction; and a detecting circuit for generating a plurality of control signals according to a phase difference between each of said delayed signals output from said forward delay circuit and said second transfer signal so that a control signal included in a plurality of said generated control signals and regarded not to have said phase difference indicates an output position of said delayed signal corresponding to itself so as to be distinguished from the output positions of other delayed signals;

wherein said second delay circuit array receives a plurality of said control signals and generating said second transfer signal by giving a delay to said first transfer signal corresponding to the delay time of said third transfer signal in said forward delay circuit in a section up to said output position indicated by said control signal so as to be distinguished from the output positions of other delayed signals.

15. A timing-control circuit device including a first logic circuit for receiving a first transfer signal and outputting a second transfer signal;

a second logic circuit for receiving said second transfer signal and outputting a third transfer signal;

a load for receiving said third transfer signal and outputting a fourth transfer signal; and a third logic circuit for transferring a fifth transfer signal between said first logic circuit and said second logic circuit;

wherein said first logic circuit has said fourth transfer signal fed back, thereby generating said second transfer signal so as to synchronize said first transfer signal in phase with said fourth transfer signal at first accuracy and said second logic circuit generates said third transfer signal so as to synchronize said first transfer signal in phase with said fourth transfer signal at second accuracy;

wherein said first logic circuit includes a first delay circuit array for detecting a first phase difference between said fourth transfer signal and said third transfer signal and generating a first control signal according to said first phase difference; and a second delay circuit array, which can change a delay time according to said first control signal;

said second logic circuit includes a third delay circuit array for detecting a second phase difference between said fifth transfer signal and said third transfer signal and generating a second control signal according to said second phase difference; and a fourth delay circuit array, which can change a delay time according to said second control signal, and said third logic circuit transfers said fifth transfer signal from said first logic circuit to said second logic circuit.

16. A timing-control circuit device in accordance with claim 15, wherein each of said first and third delay circuit arrays includes a forward delay circuit; a control circuit, and a circuit for memorizing the control signal;

wherein said forward delay circuit is mainly composed of an inverter, an AND circuit, or an OR circuit, said control circuit is mainly composed of an inverter, a NOR circuit, or a flip-flop circuit, said circuit for memorizing the control signal is mainly composed of a flip-flop circuit, each of said second and fourth delay circuit arrays is composed of an inverter, a NAND, or AND circuit and a NAND or an OR circuit, and NOR circuit, and said third logic circuit is composed of a switching circuit composed of a MOS transistor.

17. A timing-control circuit device in accordance with claim 15, wherein said first and fourth transfer signals are synchronous signal pulses having a fixed cycle respectively, and the phase of said fourth clock signal is synchronized with the phase of said first clock signal with a delay of the predetermined number of pulses from said first clock signal.

18. A timing-control circuit device in accordance with claim 15, wherein said third clock signal is fed back to said first logic circuit via said load as said fourth clock signal, and said first transfer signal is kept synchronized in phase with said fourth clock signal even when the delay time of said third transfer signal from said fourth clock signal is changed due to a static or dynamic change of said load.

19. A timing-control circuit device in accordance with claim 15, wherein the phase of said first clock signal is synchronized with the phase of said fourth clock signal after a delay time of the predetermined number of pulses.

20. A timing-control circuit device in accordance with claim 16, wherein the delay time of the delay element composing said forward delay circuit provided in said third delay circuit array is set smaller than that of the delay element composing said forward delay circuit provided in said first delay circuit array.

21. A timing-control circuit device in accordance with claim 15, wherein said third logic circuit is composed of a tri-state buffer.

22. A timing-control circuit device in accordance with claim 16, wherein a store signal generated by said circuit for memorizing the control signal provided in each of said first and third delay circuit arrays is applied to said forward delay circuit, and the delay element composing said forward delay circuit stops transfer of signals at and beyond a given position.

23. A timing-control circuit device in accordance with claim 16, wherein a select signal is output only at a given position as a store signal generated by said circuit for memorizing the control signal in each of said first and third delay circuit arrays, and a non-select signal is output at other positions respectively.

24. A timing-control circuit device in accordance with claim 15, wherein a given position is decided for a delay element selected in said fourth delay circuit array when the delay time of said third transfer signal from said fourth transfer signal is changed due to a static or dynamic change of said load, thereby the position of said delay element selected in said second delay circuit array is changed.

25. A timing-control circuit device in accordance with claim 15, wherein each of said second and fourth delay circuit arrays comprises an inverter; a tri-state buffer or an AND circuit and a tri-state buffer, or an OR circuit and a tri-state buffer.

26. A timing-control circuit device in accordance with claim 15, wherein said first and second transfer signals are entered to a delay element composed of an inverter, an AND circuit, or an OR circuit in each of said second and fourth delay circuit arrays, then output as said second and third transfer signals via a selector composed of a NAND or NOT circuit, or a tri-state buffer.

27. A timing-control circuit device including:

a first timing-control circuit for adjusting the phase difference between a first input clock signal and a first output clock signal; a second timing-control circuit for adjusting the phase difference between a second input clock signal and a second output clock signal; and a converter for transferring a clock signal from said first timing-control circuit to said second timing-control circuit, wherein each of said first and second timing-control circuits includes a forward delay circuit array for outputting said input clock signal from a first position; and a delay controlled line for entering an input signal at a second position corresponding to a control signal;

wherein said first timing-control circuit adjusts a phase difference between said input clock signal and said output clock signal at a predetermined accuracy and said converter transfers a signal whose phase is adjusted by said first timing-control circuit to said second timing-control circuit, and said second timing-control circuit uses said phase-adjusted signal, thereby adjusting a phase difference between an input signal and an output signal at a higher accuracy than that of said first timing-control circuit.

* * * * *